United States Patent
Shouji et al.

(10) Patent No.: US 8,989,231 B2
(45) Date of Patent: Mar. 24, 2015

(54) SURFACE EMITTING LASER DEVICE, SURFACE EMITTING LASER ARRAY, OPTICAL SCANNING DEVICE, IMAGE FORMING APPARATUS, AND MANUFACTURING METHOD OF SURFACE EMITTING LASER DEVICE

(71) Applicants: Hiroyoshi Shouji, Miyagi (JP); Shunichi Sato, Miyagi (JP)

(72) Inventors: Hiroyoshi Shouji, Miyagi (JP); Shunichi Sato, Miyagi (JP)

( * ) Notice: Subject to any disclaimer, the term of this patent is extended or adjusted under 35 U.S.C. 154(b) by 0 days.

(21) Appl. No.: 13/915,921

(22) Filed: Jun. 12, 2013

(65) Prior Publication Data
US 2013/0273677 A1 Oct. 17, 2013

(30) Foreign Application Priority Data

Apr. 22, 2010 (JP) ................................. 2010-098533
Oct. 18, 2010 (JP) ................................. 2010-233246
Feb. 10, 2011 (JP) ................................. 2011-026719

(51) Int. Cl.
*H01S 5/00* (2006.01)
*H01S 5/183* (2006.01)
(Continued)

(52) U.S. Cl.
CPC .......... *H01S 5/18344* (2013.01); *H01S 5/1835* (2013.01); *H01S 5/18386* (2013.01); *H01S 5/18347* (2013.01); *H01S 5/18327* (2013.01); *H01S 5/3202* (2013.01); *H01S 5/18391* (2013.01); *H01S 5/18377* (2013.01); *B41J 2/471* (2013.01); *H01S 2301/18* (2013.01); *H01S 5/423* (2013.01); *H01S 5/18311* (2013.01); *H01S 5/18338* (2013.01); *H01S 5/18355* (2013.01)

USPC ............... 372/50.124; 372/43.01; 372/45.01; 372/46.01

(58) Field of Classification Search
USPC .............................. 372/43.01, 45.01, 50.124
See application file for complete search history.

(56) References Cited

U.S. PATENT DOCUMENTS 5,923,691 A 7/1999 Sato
5,939,733 A 8/1999 Sato
(Continued)

FOREIGN PATENT DOCUMENTS

EP 1130720 A1 9/2001
JP 7-193332 7/1995
(Continued)

OTHER PUBLICATIONS

Nov. 9, 2011 European search report in connection with counterpart European patent application No. 11 16 2686.
(Continued)

*Primary Examiner* — Dung Nguyen

(57) ABSTRACT

A disclosed surface emitting laser device includes a light emitting section having a mesa structure where a lower reflection mirror, an oscillation structure, and an upper reflection mirror are laminated on a substrate, the oscillation structure including an active layer, the upper reflection mirror including a current confined structure where an oxide surrounds a current passage region, a first dielectric film that coats the entire surface of an emitting region of the light emitting section, the transparent dielectric including a part where the refractive index is relatively high and a part where the refractive index is relatively low, and a second dielectric film that coats a peripheral part on the upper surface of the mesa structure. Further, the dielectric film includes a lower dielectric film and an upper dielectric film, and the lower dielectric film is coated with the upper dielectric film.

4 Claims, 24 Drawing Sheets

(51) Int. Cl.
*B41J 2/47* (2006.01)
*H01S 5/32* (2006.01)
*H01S 5/42* (2006.01)

(56) References Cited

U.S. PATENT DOCUMENTS

| | | |
|---|---|---|
| 6,002,700 A | 12/1999 | Sato |
| 6,072,196 A | 6/2000 | Sato |
| 6,207,973 B1 | 3/2001 | Sato et al. |
| 6,233,264 B1 | 5/2001 | Sato |
| 6,542,528 B1 | 4/2003 | Sato et al. |
| 6,563,851 B1 | 5/2003 | Jikutani et al. |
| 6,614,821 B1 | 9/2003 | Jikutani et al. |
| 6,661,823 B1 | 12/2003 | Otoma et al. |
| 6,674,785 B2 | 1/2004 | Sato et al. |
| 6,765,232 B2 | 7/2004 | Takahashi et al. |
| 6,803,604 B2 | 10/2004 | Takahashi et al. |
| 6,927,412 B2 | 8/2005 | Takahashi et al. |
| 6,959,025 B2 | 10/2005 | Jikutani et al. |
| 6,975,663 B2 | 12/2005 | Sekiya et al. |
| 7,684,458 B2 | 3/2010 | Sato et al. |
| 7,693,204 B2 | 4/2010 | Sato et al. |
| 7,720,125 B2 | 5/2010 | Jikutani et al. |
| 7,746,912 B2 | 6/2010 | Motomura et al. |
| 8,624,950 B2 * | 1/2014 | Jikutani et al. ............. 347/238 |
| 2004/0028103 A1 | 2/2004 | Ueki |
| 2006/0093006 A1 | 5/2006 | Jikutani |
| 2006/0269666 A1 | 11/2006 | Nagawa et al. |
| 2008/0055672 A1 | 3/2008 | Watanabe et al. |
| 2008/0151961 A1 | 6/2008 | Kim et al. |
| 2008/0233017 A1 | 9/2008 | Sato et al. |
| 2009/0155944 A1 | 6/2009 | Jikutani |
| 2009/0262770 A1 | 10/2009 | Itoh et al. |
| 2009/0285252 A1 | 11/2009 | Ishii et al. |
| 2009/0285602 A1 | 11/2009 | Harasaka et al. |
| 2009/0295902 A1 | 12/2009 | Sato et al. |
| 2009/0303308 A1 | 12/2009 | Itoh et al. |
| 2009/0310632 A1 | 12/2009 | Sugawara et al. |
| 2010/0060712 A1 | 3/2010 | Sato et al. |
| 2010/0189467 A1 | 7/2010 | Sato et al. |
| 2010/0214633 A1 | 8/2010 | Sato et al. |
| 2012/0086765 A1 * | 4/2012 | Higashi et al. ............. 347/248 |

FOREIGN PATENT DOCUMENTS

| | | |
|---|---|---|
| JP | 10-41222 | 2/1998 |
| JP | 2001-156395 | 6/2001 |
| JP | 2004-245861 | 9/2004 |
| JP | 2006-86498 | 3/2006 |
| JP | 2006-210429 | 8/2006 |
| JP | 2007-299897 | 11/2007 |
| JP | 2008-140811 | 6/2008 |
| JP | 2010-21522 | 1/2010 |
| JP | 2010-56528 | 3/2010 |

OTHER PUBLICATIONS

Japanese official action dated Apr. 24, 2014 in corresponding Japanese patent application No. 2011-026719.

* cited by examiner

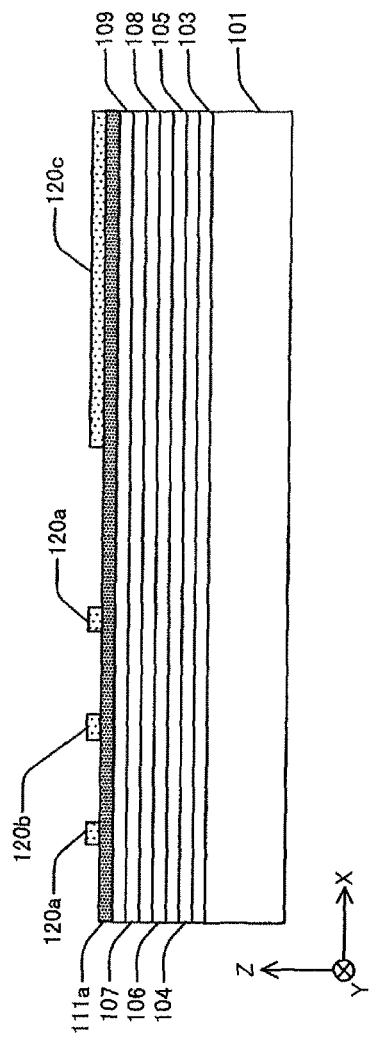

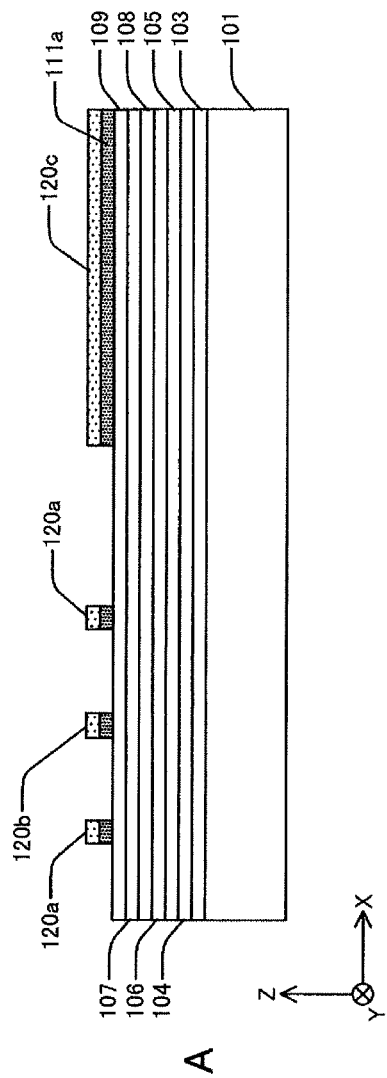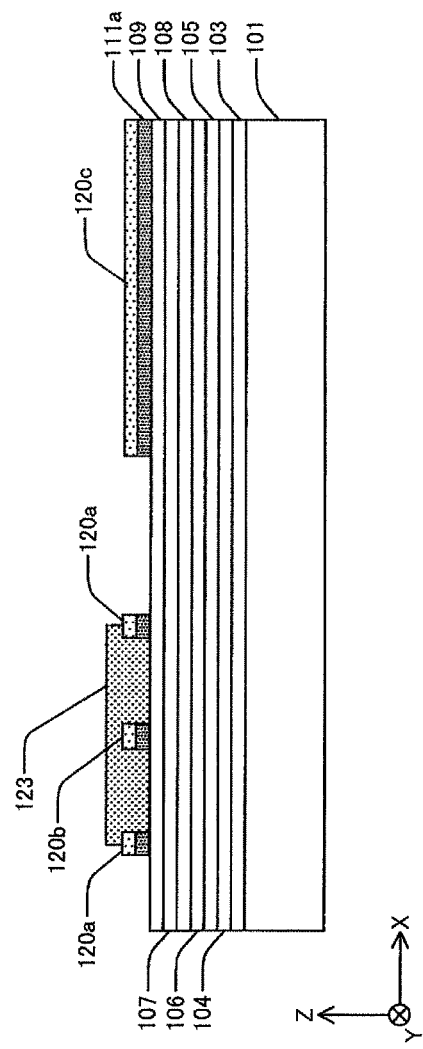

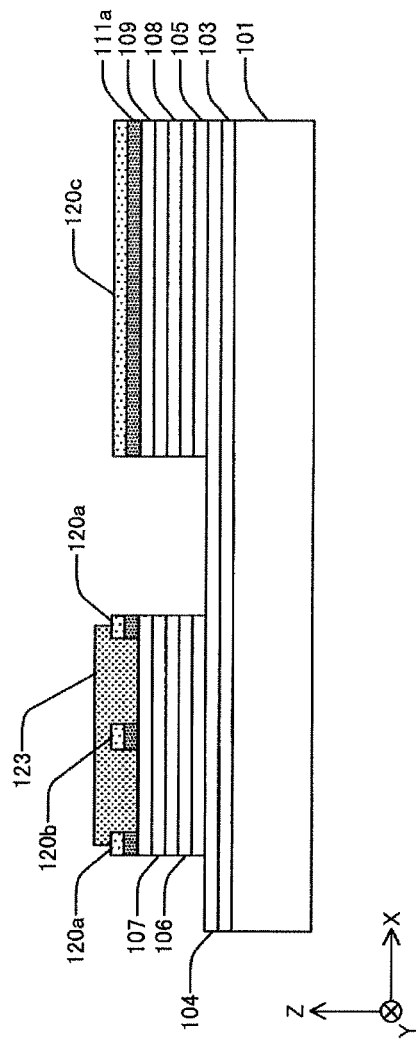
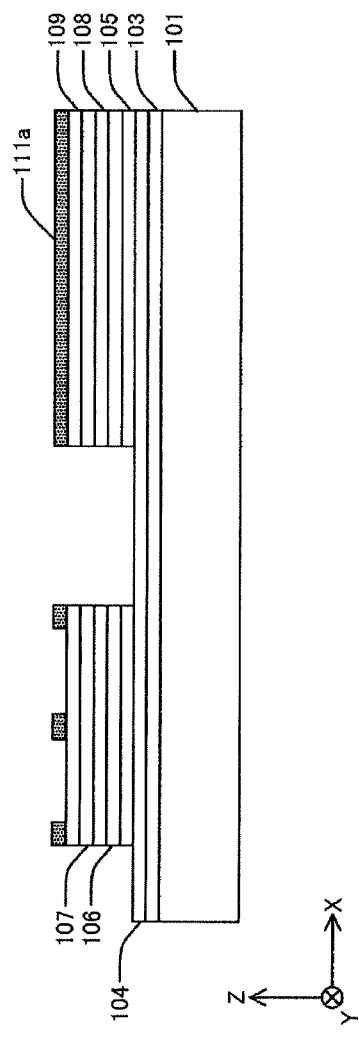
FIG.12A
FIG.12B

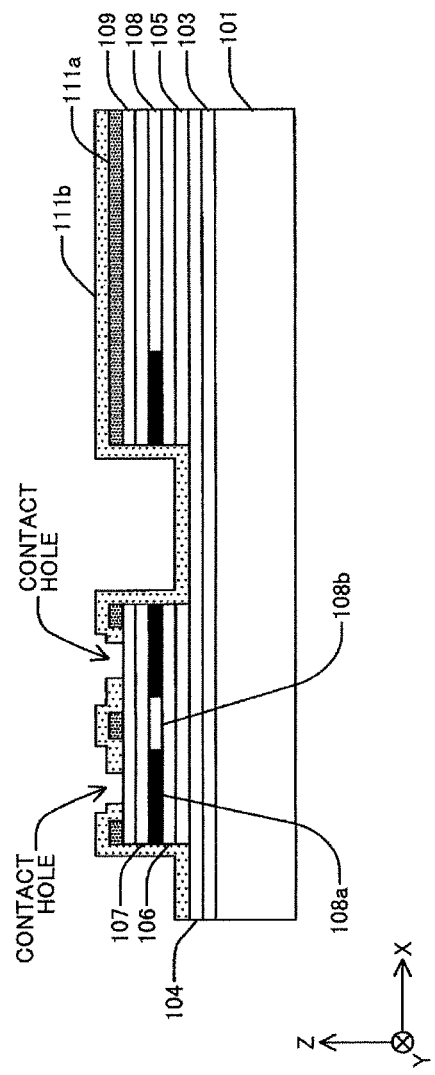

SURFACE EMITTING LASER DEVICE, SURFACE EMITTING LASER ARRAY, OPTICAL SCANNING DEVICE, IMAGE FORMING APPARATUS, AND MANUFACTURING METHOD OF SURFACE EMITTING LASER DEVICE

CROSS-REFERENCE TO RELATED APPLICATIONS

The present application is a divisional of U.S. application Ser. No. 13/084,942, filed Apr. 12, 2011 which claims priority under 35 U.S.C. §119 based on Japanese Patent Application Nos. 2010-098533 filed Apr. 22, 2010, 2010-233246 filed Oct. 18, 2010, and 2011-026719 filed Feb. 10, 2011 the entire contents of which are hereby incorporated herein by reference.

BACKGROUND OF THE INVENTION

1. Field of the Invention

The present invention relates to a surface emitting laser device, a surface emitting laser array, an optical scanning device, an image forming apparatus, and a manufacturing method of the surface emitting laser device. More particularly, the present invention relates to a surface emitting laser device and a surface emitting laser array capable of emitting light in the direction orthogonal to their substrate surfaces, an optical scanning device including the surface emitting laser device or the surface emitting laser array, an image forming apparatus having the optical scanning device, and a manufacturing method of manufacturing the surface emitting laser device capable of emitting light in the direction orthogonal to its substrate surface.

2. Description of the Related Art

A Vertical Cavity Surface Emitting Laser (hereinafter may be referred to as "VCSEL") is capable of emitting light in the direction orthogonal to its substrate. When compared with edge emitting semiconductor lasers capable of emitting light in the direction parallel to its substrate, the VCSEL may have some advantages such as lower cost, lower energy consumption, smaller size, preferable for two-dimensionally integrated devices, and higher performance. Recently, because of those advantages, the VCSEL has attracted increased attention.

The surface emitting laser has a current confined structure to enhance current influx efficiency. To form the current confined structure, a selective oxidation process is usually performed on an AlAs (Al: Aluminum, As: Arsenic) layer. In the following, the current confined structure may also be referred to as an "oxide-confined structure" for convenience.

The oxide-confined structure may be formed by forming a mesa structure having predetermined sizes and having a side surface where a selectively-oxidized layer made of p-AlAs is exposed. Then, the formed mesa structure is processed under a water-vapor atmosphere so that aluminum (Al) in the selectively-oxidized layer is selectively oxidized from the side surface of the mesa structure. By doing this, an unoxidized region remains in the center portion of the mesa structure. The unoxidized region (hereinafter referred to as a "confined region" for explanatory purposes) becomes a passing region (or a "current passage region") through which a driving current of the surface emitting laser passes. As described above, the current may be easily confined. The refractive index of the aluminum-oxidized layer ($Al_xO_y$) (hereinafter simplified as an "oxidized layer") in the oxide-confined structure is approximately 1.6, which is lower than that of semiconductor layers. Because of this feature, a refractive index difference is generated in the lateral direction in a resonator structure of the surface emitting laser, and the light is confined in the center of the mesa structure, thereby improving the emission efficiency of the surface emitting laser. As a result, it becomes possible to obtain excellent characteristics such as lower threshold current and higher efficiency.

The surface emitting laser may be generally applied to a light source of an optical writing system in a printer (oscillation wavelength: 780 nm band), a light source of an optical writing system in an optical disk device (oscillation wavelength: 780 nm band and 850 nm band), and a light source of an optical transmission system such as a LAN (Local Area Network) using optical fibers (oscillation wavelength: 1.3 µm band and 1.5 µm band). Further, the surface emitting laser is also expected to be used as a light source for optical transmission between boards, within a board, and between chips and within a chip in a Large Scale Integrated circuit (LSI).

In those application fields, it is generally required that a cross-sectional shape of the light emitted from the surface emitting laser (hereinafter referred to as "emitting light") be circular. To achieve the circular cross-sectional shape, it is required to control higher-order transverse-mode oscillation.

For example, Japanese Patent Application Publication No. 2001-156395 (Patent Document 1) discloses a surface emitting laser device where a semiconductor material layer structure in which a light emitting layer is disposed between an upper reflection mirror structure and a lower reflection mirror structure is formed on a substrate, an upper electrode having an annular shape when viewed from the top is formed on the upper side of the upper reflection mirror structure, an opening is formed on the inner side of the upper electrode, and a part of the surface of the opening is coated with a layer transparent to the oscillation wavelength of the oscillated laser light.

Further, Japanese Patent Application Publication No. 2006-210429 (Patent Document 2) discloses a surface emitting laser device including an active layer having a light emitting center region, a pair of multi-film reflection mirrors sandwiching the active layer, one of the multi-film reflection mirrors having a light emitting region, an electrode having an opening part corresponding to the light emitting region, and an insulating film formed to be corresponding to the light emitting region in a manner such that the reflection rate in a peripheral part surrounding a center part corresponding to the light emitting center region is lower than the reflection rate in the center part. Further, in the part corresponding to the center part of the light emitting region, the insulating film is made of a structure where a first insulating film and a second insulating film are laminated. Further, in the part corresponding to the peripheral part of the light emitting region, there is a third insulating film having a refractive index lower than that of the first insulating film.

SUMMARY OF THE INVENTION

Means for Solving the Problems

The inventors of the present invention have conducted extensive research on this technical field and have obtained new knowledge that, when an optically transparent film (hereinafter simplified as a "mode filter") is formed on an emitting surface of a laser light (as exemplarily illustrated in FIGS. 1A and 1B), a light emitting angle (indicated in FIG. 1A) is influenced by the relative positional relationship between the current passage region and the mode filter. In the figures, an XYZ three-dimensional orthogonal coordinate system is employed, assuming that the Z axis direction is a direction orthogonal to the surface of the substrate. Further, the mode filter has a rectangular shape.

Further, the "light emitting angle" refers to an inclined angle between the direction orthogonal to surface of the substrate (in this case, Z axis direction) and the direction along which the emitted light intensity is maximized. Herein, a clockwise inclined direction relative to the direction orthogonal to the surface of the substrate is indicated by a plus sign (+), and on the other hand, a counterclockwise inclined direction relative to the direction orthogonal to the surface of the substrate is indicated by a minus sign (−).

Further, FIGS. 2 and 3 illustrate a relationship between a positional displacement amount and the light emitting angle, the positional displacement amount being between the centroid of the mode filter and the center of the current passage region when viewed from a direction orthogonal to the surface of the substrate. Hereinafter, the positional displacement amount may be simplified as "displacement amount".

More specifically, FIG. 2 illustrates results of experiments conducted to measure the light emitting angle while changing the centroid of the mode filter relative to the center of the current passage region in the Y axis direction. In this case, it is assumed that when the direction of the displacement amount is in the +Y direction, the displacement amount is indicated by the plus sign (+); on the other hand, when the direction of the displacement amount is in the −Y direction, the displacement amount is indicated by the minus sign (−). As the results of the experiments, the light emitting angle in the X axis direction is substantially constant and is substantially the same as 0 degrees when the displacement amount changes in the Y axis direction. On the other hand, the magnitude (absolute value) of the light emitting angle in the Y axis direction is likely to increase as the magnitude (absolute value) of the displacement amount in the Y axis direction increases.

On the other hand, FIG. 3 shows results of experiments conducted to measure the light emitting angle while changing the centroid of the mode filter relative to the center of the current passage region in the X axis direction. In this case, it is assumed that when the direction of the displacement amount is in the +X direction, the displacement amount is indicated by the plus sign (+); on the other hand, when the direction of the displacement amount is in the −X direction, the displacement amount is indicated by the minus sign (−). As the results of the experiments, the light emitting angle in the Y axis direction is substantially constant and is substantially the same as 0 degrees when the displacement amount changes in the X axis direction. On the other hand, the magnitude (absolute value) of the light emitting angle in the X axis direction is likely to increase as the magnitude (absolute value) of the displacement amount in the X axis direction increases.

To obtain high-resolution images in an image forming apparatus, it may be important to form a minute circular light spot at a desired position on a to-be-scanned surface. Further, to form the minute circular light spot at the desired position on the to-be-scanned surface, according to results of various experiments and theoretical calculations, it may be necessary to control the magnitude (absolute value) of the light emitting angle in all the directions to be equal to or less than 0.2 degrees.

To that end, according to the relationship illustrated in FIGS. 2 and 3, it may be necessary to control (reduce) the magnitude (absolute value) of the displacement amount in the surface emitting laser to be equal to or less than 0.1 µm.

However, when the method disclosed in Patent Documents 1 or 2 is used, the obtained accuracy may be approximately 1 µm in the alignment in a photo-lithography process. Therefore, it is difficult to stably manufacture the surface emitting lasers having the magnitude (absolute value) of the displacement amount equal to or less than 0.1 µm.

The inventors of the present invention have discovered a method of accurately forming the mode filter at its desired position. However, when the method is used, in a process of forming a contact hole for the p-side electrode in manufacturing the surface emitting laser device, it is found that an air space described below may be undesirably formed.

Further, in a process of forming the contact hole for the p-side electrode in manufacturing a surface emitting laser device, wet etching using buffered hydrofluoric acid (SHE) is performed. In this case, for example, in a case where two dielectric layers are formed on a contact layer, and when the lower dielectric layer is made of $SiO_2$ and the upper dielectric layer is made of a SiN film, a side-etching amount of the lower dielectric layer is greater than the side-etching amount of the upper dielectric layer due to the difference of the etching rate. Because of this feature, it is newly found that the lower dielectric layer may recede and an air space may be formed as illustrated in FIG. 4.

When the air space is formed, even when sufficient rinsing is performed after the etching, it may be difficult to completely remove the BHF. As a result, in the worst case, the service life time of the laser may be affected by the residue of the BHF.

Further, when the air space exists, a residue may be left in resist work of the next process or the like. Due to the residue, a value of an element (resistor) may be increased and adhesion of the p-side electrode may be reduced.

Further, disconnection caused by step due to the coverage failure of the electrode wiring at eaves of the upper dielectric layer, and bend or fracture of the eaves of the upper dielectric layer may occur.

Further, in a case where the upper dielectric layer is formed by the plasma CVD (Chemical Vapor Deposition) method, the dielectric layer includes hydrogen. On the other hand, the etching rate for the BHF is decreased when the hydrogen content in the layer is low; and the etching rate for the BHF is increased when the hydrogen content in the layer is high. Because of this feature, it may be necessary to reduce etching time for the upper dielectric layer formed in the plasma CVD method by controlling the hydrogen content based on the film forming conditions.

As an etching method of forming the contact hole, the dry etching method may be used. However, in the dry etching, it may be difficult to detect an end point of etching. Further, when the etching is insufficient, a contact failure may occur. On the other hand, when over etching is done, the contact layer may be thinner, which may increase the resistance value of the element (resistor). Further, in dry etching, the etching rate in the outer part of a surface is likely to be higher and the etching rate in the center part of the surface is likely to be lower, which may cause film thickness variation. The value of the film thickness variation depends on the etching devices. For example, in the case of an RIE (Reactive Ion Etching) device, the difference of the thickness of a contact layer between the outer part and the center part of the surface is in a range from 5 nm to 10 nm. As a result, the element resistance value may vary within the surface.

The present invention is made based on the above new knowledge gained by the inventors.

According to an aspect of the present invention, a surface emitting laser device includes a light emitting section having a mesa structure where a lower reflection mirror, an oscillation structure, and an upper reflection mirror are laminated on a substrate, the oscillation structure including an active layer, the upper reflection mirror including a current confined structure where an oxide surrounds a current passage region; a first dielectric film that coats the entire surface of an emitting region of the light emitting section, the transparent dielectric including a part where the refractive index is relatively high and a part where the refractive index is relatively low; and a second dielectric film that coats a peripheral part on the upper surface of the mesa structure. Further, the dielectric film includes a lower dielectric film and an upper dielectric film, and the lower dielectric film is coated with the upper dielectric film.

BRIEF DESCRIPTION OF THE DRAWINGS

Other objects, features, and advantages of the present invention will become more apparent from the following description when read in conjunction with the accompanying drawings, in which:

FIGS. 9A through 9C are cross-sectional views illustrating a manufacturing method of manufacturing the surface emitting laser device;

FIGS. 11A and 11B are another cross-sectional views illustrating the manufacturing method of manufacturing the surface emitting laser device;

FIGS. 12A through 12C are another cross-sectional views illustrating the manufacturing method of manufacturing the surface emitting laser device;

FIG. 18 is another cross-sectional view illustrating the manufacturing method of manufacturing the surface emitting laser device;

DETAILED DESCRIPTION OF THE PREFERRED EMBODIMENTS

Figure 5:
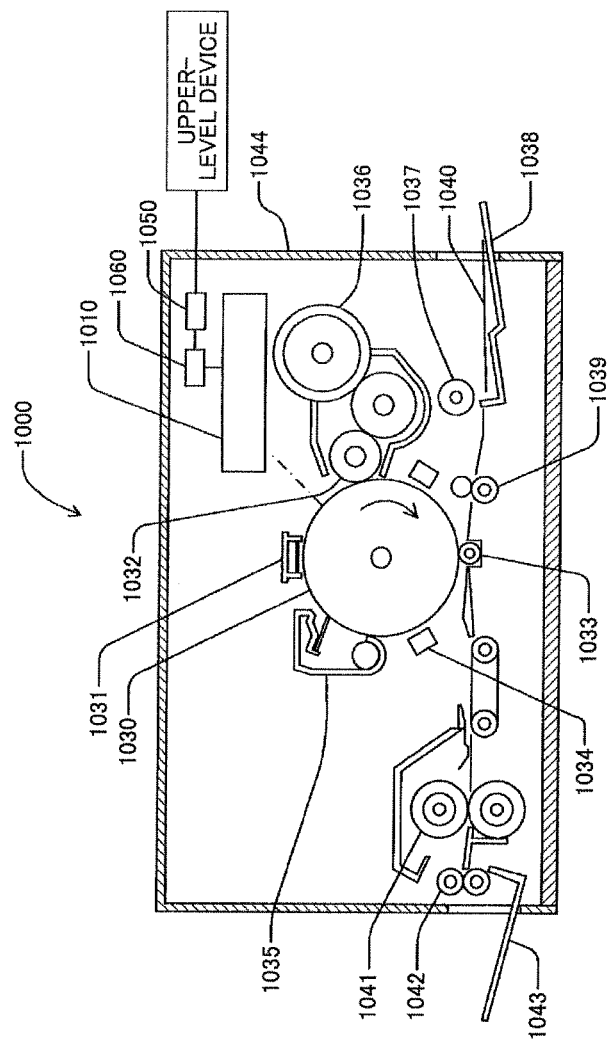
FIG. 5 is a schematic view illustrating a configuration of a laser printer according to an embodiment of the present invention.

In the following, an embodiment of the present invention is described with reference to FIGS. 5 through 21. FIG. 5 schematically illustrates a configuration of a laser printer 1000 as an image forming apparatus according to an embodiment of the present invention.

As illustrated in FIG. 5, the laser printer 1000 includes an optical scanning device 1010, a photosensitive drum 1030, a charger 1031, a developing roller 1032, a transfer charger 1033, a neutralizing unit 1034, a cleaning unit 1035, a toner cartridge 1036, a sheet feeding roller 1037, a sheet feeding tray 1038, a resist roller pair 1039, a fixing roller 1041, a discharging roller 1042, a discharging tray 1043, a communication control device 1050, and a printer controlling device 1060 generally controlling the above elements. These elements are disposed at their respective positions in a printer chassis 1044.

The communication control device 1050 controls two-way communications with an upper-level device (e.g., a personal computer) via a network.

The photosensitive drum 1030 has a cylindrical shape, and a photosensitive layer is formed on the surface of the photosensitive drum 1030. Namely, the surface of the photosensitive drum 1030 is a surface to be scanned. The photosensitive drum 1030 rotates in the direction indicated by the arrow (indicated in the photosensitive drum 1030) in FIG. 5.

The charger 1031, the developing roller 1032, the transfer charger 1033, the neutralizing unit 1034, and the cleaning unit 1035 are disposed in the vicinity of the surface of the photosensitive drum 1030. Further, the charger 1031, the developing roller 1032, the transfer charger 1033, the neutralizing unit 1034, and the cleaning unit 1035 are sequentially arranged in this order along the rotating direction of the photosensitive drum 1030.

The charger 1031 uniformly charges the surface of the photosensitive drum 1030.

The optical scanning device 1010 scans a light flux on the surface of the photosensitive drum 1030, the light flux being modulated based on image information from the upper-level device, the surface of the photosensitive drum 1030 being charged by the charger 1031. By doing this, a latent image based on the image information is formed on the surface of the photosensitive drum 1030. The formed latent image is moved to the direction of the developing roller 1032 by the rotation of the photosensitive drum 1030. The configuration of the optical scanning device 1010 is described below.

The toner cartridge 1036 contains toner, and the toner is supplied to the developing roller 1032.

The developing roller 1032 causes the toner supplied from the toner cartridge 1036 to adhere onto the latent image formed on the surface of the photosensitive drum 1030 to visualize the image information. The latent image with toner adhered (hereinafter may be referred to as a "toner image" for convenience) is moved in the direction of the transfer charger 1033 by the rotation of the photosensitive drum 1030.

The sheet feeding tray 1038 stores recording sheets 1040. In the vicinity of the sheet feeding tray 1038, the sheet feeding roller 1037 is provided. The sheet feeding roller 1037 feeds the recording sheets 1040 from the sheet feeding tray 1038 to the resist roller pair 1039 one by one. The resist roller pair 1039 first holds the recording sheet 1040 taken out by the sheet feeding roller 1037, and sends out the recording sheet 1040 toward the gap between the photosensitive drum 1030 and the transfer charger 1033 in synchronization with the rotation of the photosensitive drum 1030.

A voltage having the polarity opposite to the polarity of the voltage of the toner is applied to the transfer charger 1033 to electrically attract the toner on the surface of the photosensitive drum 1030 to the recording sheet 1040. By applying the voltage, the toner image on the surface of the photosensitive drum 1030 is transferred onto the recording sheet 1040. The recording sheet 1040 with the transferred toner image is fed to the fixing roller 1041.

The fixing roller 1041 applies heat and pressure to the recording sheet 1040 to fix the toner onto the recording sheet 1040. The fixed recording sheets 1040 are discharged to the discharging tray 1043 to be sequentially stacked on the discharging tray 1043.

The neutralizing unit 1034 neutralizes the surface of the photosensitive drum 1030.

The cleaning unit 1035 removes the toner remaining on the surface of the photosensitive drum 1030 (residual toner). The surface of the photosensitive drum 1030 on which the residual toner is removed is returned to the position facing the charger 1031 again.

Next, a configuration of the optical scanning device 1010 is described.

Figure 6:
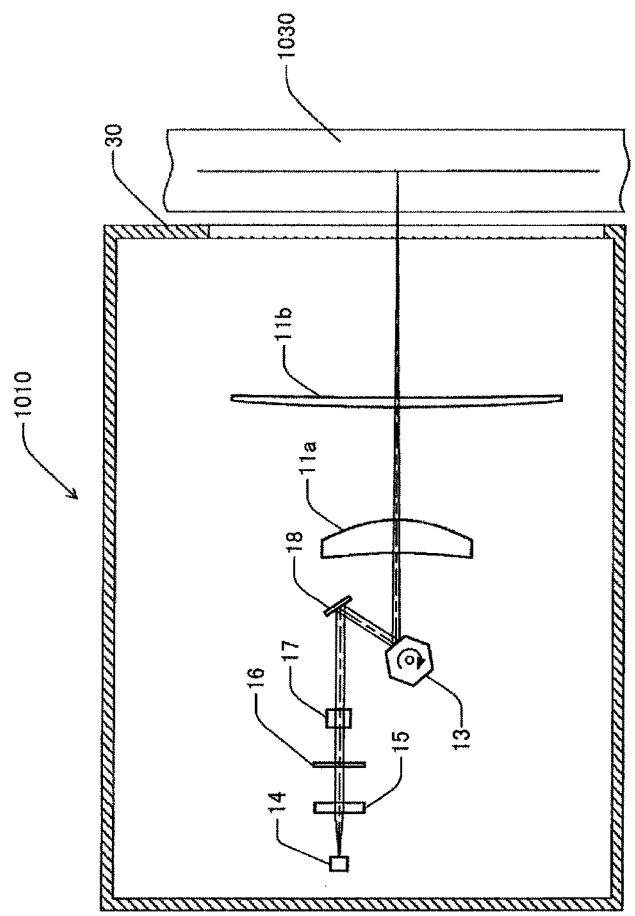
FIG. 6 is a schematic view illustrating an optical scanning device in FIG. 5.

For example, as illustrated in FIG. 6, the optical scanning device 1010 includes a deflector-side scanning lens 11*a*, an image-surface-side scanning lens 11*b*, a polygon mirror 13, a light source 14, a coupling lens 15, an aperture plate 16, a cylindrical lens 17, a reflection mirror 18, a scanning control device (not shown) and the like. These elements are disposed at their respective positions in an optical housing 30.

In the following, for convenience, the direction corresponding to a main scanning direction is simplified as a "main-scanning corresponding direction", and the direction corresponding to a sub-scanning direction is simplified as a "sub-scanning corresponding direction".

The coupling lens 15 converts the light flux output from the light source 14 into a substantially parallel light beam.

The aperture plate 16 has an opening to determine the diameter of the beam of the light flux having passed through the coupling lens 15.

The cylindrical lens 17 forms an image by refracting the light flux having passed through the opening of the aperture plate 16 onto the vicinity of the deflection reflection surface of the polygon mirror 13 with respect to the sub-scanning corresponding direction via the reflection mirror 18.

The optical system disposed on the optical path between the light source 14 and the polygon mirror 13 may also be called a pre-deflector optical system. In this embodiment, the pre-deflector optical system includes the coupling lens 15, the aperture plate 16, the cylindrical lens 17, and the reflection mirror 18.

For example, the polygon mirror 13 is made of a regular hexagonal cylindrical member, so that the polygon mirror 13 has six deflection reflection surfaces formed on the six side surfaces, respectively, of the polygon mirror 13. The polygon mirror 13 rotates at a constant speed around an axis parallel to the sub-scanning corresponding direction so as to deflect the light flux from the reflection mirror 18.

The deflector-side scanning lens 11*a* is disposed on the optical path of the light flux deflected by the polygon mirror 13.

The image-surface-side scanning lens 11*b* is disposed on the optical path of the light flux having passed through the deflector-side scanning lens 11*a*. The light flux having passed through the image-surface-side scanning lens 11*b* is transmitted onto the surface of the photosensitive drum 1030 to form a light spot. The light spot moves in the longitudinal direction of the photosensitive drum 1030 in accordance with the rotation of the polygon mirror 13. Namely, the light spot is scanned on the surface of the photosensitive drum 1030. This moving direction of the light spot is the "main-scanning corresponding direction". Further, the rotation direction of the photosensitive drum 1030 is the "sub-scanning corresponding direction".

The optical system disposed on the optical path between the polygon mirror 13 and the photosensitive drum 1030 may also be called a scanning optical system. In this embodiment, the scanning optical system includes the deflector-side scanning lens 11*a* and the image-surface-side scanning lens 11*b*. Further, at least one folding mirror may be disposed on at least one of the optical paths between the deflector-side scanning lens 11*a* and the image-surface-side scanning lens 11*b* and between the image-surface-side scanning lens 11*b* and the photosensitive drum 1030.

Figure 7:
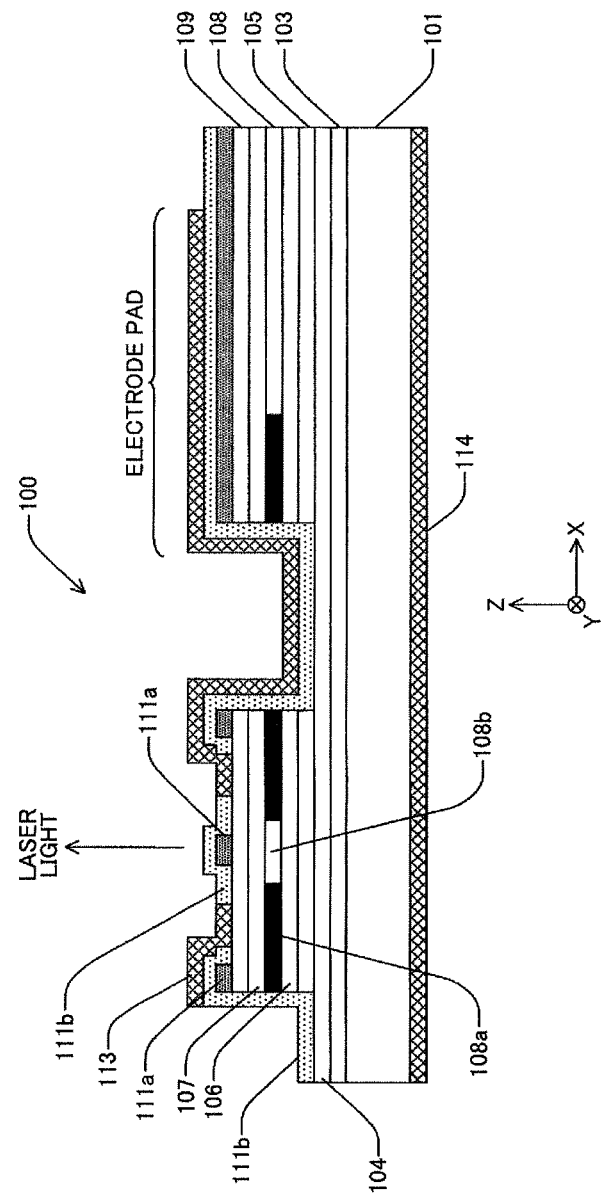
FIG. 7 is a drawing illustrating a surface emitting laser device included in a light source of FIG. 6.

For example, as illustrated in FIG. 7, the light source 14 includes a surface emitting laser device 100. In this description, it is assumed that the Z axis direction in the figures is the direction parallel to the laser oscillation direction, and X axis direction and Y axis direction are orthogonal to each other in a plane orthogonal to the Z axis direction. FIG. 7 is a cross-sectional view when the surface emitting laser device 100 is cut along the XZ plane.

The surface emitting laser device 100 is designed to oscillate at the wavelength band of 780 nm. As shown in FIG. 7, the surface emitting laser device 100 includes a substrate 101, a lower semiconductor DBR (Distribution Bragg Reflection) 103, a lower spacer layer 104, an active layer 105, an upper spacer layer 106, an upper semiconductor DBR 107, and a contact layer 109.

Figure 8A:
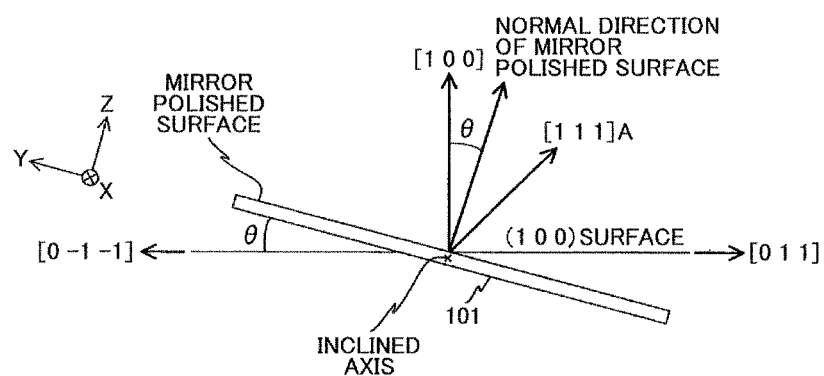
FIGS. 8A and 8B are drawings illustrating the substrates of the surface emitting laser device.
Figure 8B:
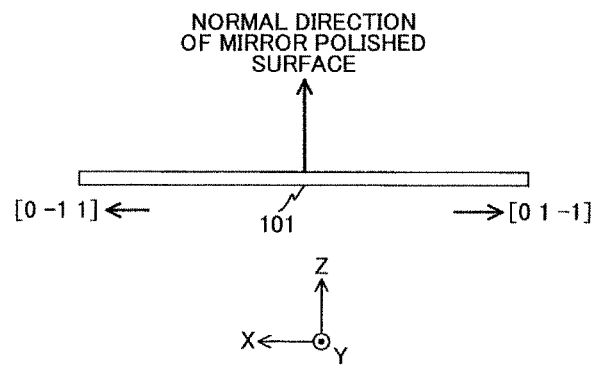

The surface of the substrate 101 is an n-GaAs single-crystal semiconductor substrate and has a mirror polished surface. Further, as illustrated in FIG. 8A, the normal direction of the mirror polished surface (main surface) of the substrate 101 is inclined relative to the crystal orientation [100] direction toward the crystal orientation [111]A direction by an angle of 15 degrees ($\theta=15$ degrees). Namely, the substrate 101 is a so-called inclined substrate. Herein, as illustrated in FIG. 8B, the substrate 101 is disposed in a manner such that the crystal orientation [0-11] direction is parallel to the +X direction and the crystal orientation [01-1] direction is parallel to the −X direction.

Referring back to FIG. 7, the lower semiconductor DBR 103 is laminated on a buffer layer (not shown) on the +Z side of the substrate 101, and includes 37.5 pairs of a low refractive index layer made of n-$Al_{0.9}Ga_{0.1}As$ and a high refractive index layer made of n-$Al_{0.3}Ga_{0.7}As$. Further, composition gradient layers (not shown) having the thickness of 20 nm are interposed between adjacent ones of the refractive index layers to reduce the electrical resistance. In the composition gradient layers, the composition is gradually changed from one component to another component. Further, each of the refractive index layers is designed so that the optical thickness of the refractive index layer and one-half of each of the composition gradient layers adjoining the refractive index layer is equal to $\lambda/4$ ($\lambda$: oscillation wavelength). Further, there is a relationship between the optical thickness of a layer and an actual thickness of the layer, in which when the optical thickness of a layer is $\lambda/4$, the actual thickness "D" of the layer is expressed by the following formula:

$$D=\lambda/4n$$

where the symbol "n" denotes a refractive index of the medium of the layer.

The lower spacer layer 104 is laminated on the +Z side of the lower semiconductor DBR 103, and is a layer made of non-doped $Al_{0.6}Ga_{0.4}As$.

The active layer 105 is laminated on the +Z side of the lower spacer layer 104, and includes three quantum well layers and four barrier layers. Each of the quantum well layers is made of $Al_{0.12}Ga_{0.88}As$, and each of the barrier layer is made of $Al_{0.3}Ga_{0.7}As$.

The upper spacer layer 106 is laminated on the +Z side of the active layer 105 and is a layer made of non-doped $Al_{0.6}Ga_{0.4}As$.

The part including the lower spacer layer 104, the active layer 105, and the upper spacer layer 106 may also be called an "oscillator structure". The oscillation structure is designed so that its optical length is equal to one wavelength in optical thickness. Further, the active layer 105 is disposed at the position of the middle of the "oscillator structure" to obtain high stimulated emission probability, the position corresponding to an antinode position of the standing wave distribution of the electric field.

The upper semiconductor DBR 107 is laminated on the +Z side of the upper spacer layer 106, and includes 24 pairs of a low refractive index layer made of p-$Al_{0.9}Ga_{0.1}As$ and a high refractive index layer made of p-$Al_{0.3}Ga_{0.7}As$. Further, composition gradient layers (not shown) are interposed between adjacent ones of the refractive index layers to reduce the electrical resistance. In the composition gradient layers, the composition is gradually changed from one component to another component. Further, each of the refractive index layers is designed so that the optical thickness of the refractive index layer and one-half of each of the composition gradient layers adjoining the refractive index layer is equal to $\lambda/4$.

Further, a selectively-oxidized layer 108 made of p-AlAs is disposed in the upper semiconductor DBR 107 and at the position optically separated from the oscillator structure by $\lambda/4$. In FIG. 7, for convenience purposes, the selectively-oxidized layer 108 is shown as being between the upper semiconductor DBR 107 and the oscillator structure.

The contact layer 109 is laminated on the +Z side of the upper semiconductor DBR 107, and is a layer having a film thickness of 25 nm and being made of p-GaAs.

In the following, for convenience, the structure in which the plural semiconductor layers are laminated on the substrate 101 may be called a "laminated body".

Next, a method of manufacturing the surface emitting laser device 100 is described.

Figure 1A:
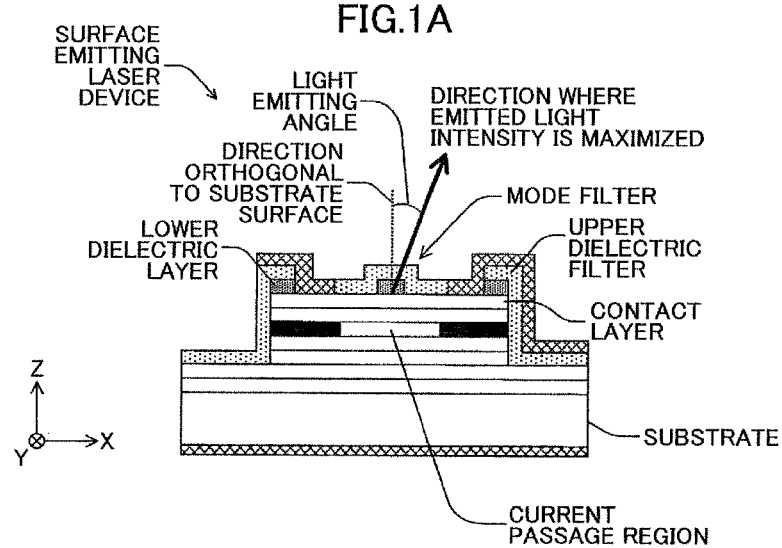
FIGS. 1A and 1B are drawings illustrating a mode filter and a light emitting angle, respectively.
Figure 1B:
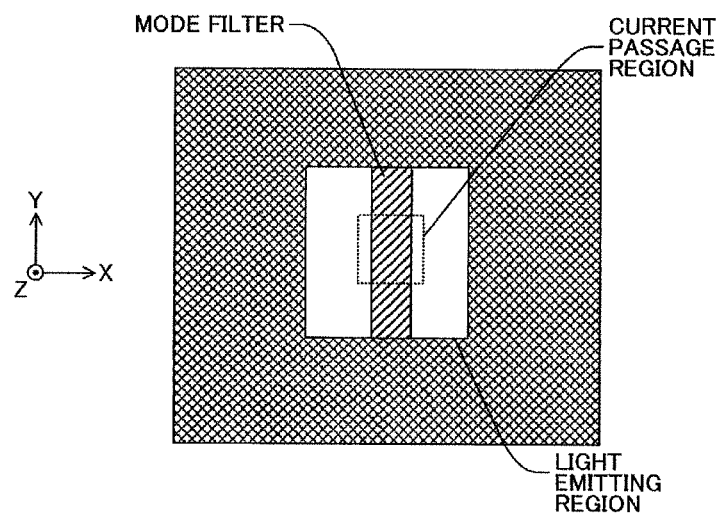
Figure 2:
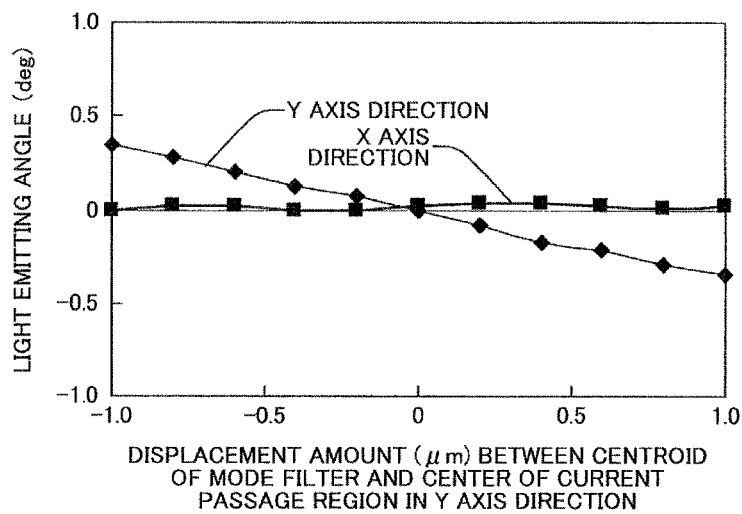
FIG. 2 is a graph illustrating relationships between a displacement amount of a mode filter in the Y axis direction and the light emitting angle.
Figure 3:
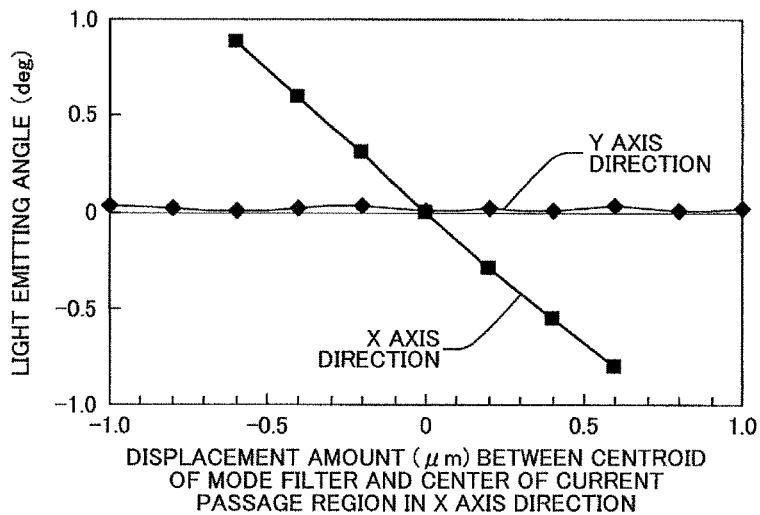
FIG. 3 is a graph illustrating relationships between a displacement amount of a mode filter in the X axis direction and the light emitting angle.

(1) The above laminated body is formed by crystal growth by the MOCVD (Metal Organic Chemical Vapor Deposition) method or the MBE (Molecular Beam Epitaxy) method (see FIG. 1A).

Herein, in the case of MOCVD method, for example, trimethyl aluminum (TMA), trimethyl gallium (TMG), or trimethyl indium (TMI) is used as a group III material. Further, phosphine ($PH_3$) or arsine ($AsH_3$) is used as a group V material. Carbon tetrabromide ($CBr_4$) or dimethylzinc (DMZn) is used as a p-type dopant material, and hydrogen selenide ($H_2Se$) is used as an n-type dopant material.

Figure 9A:
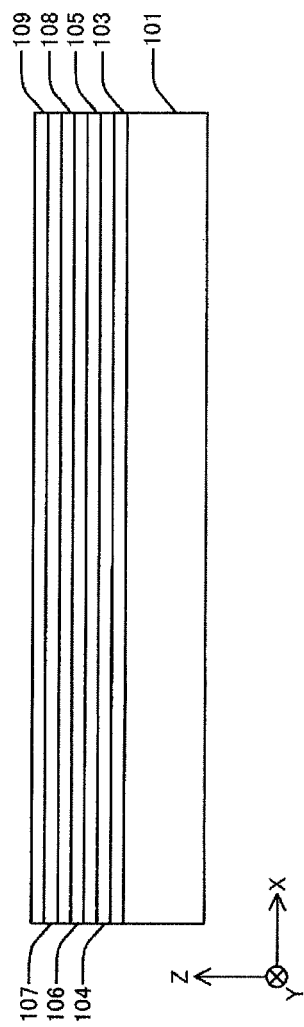
Figure 9B:
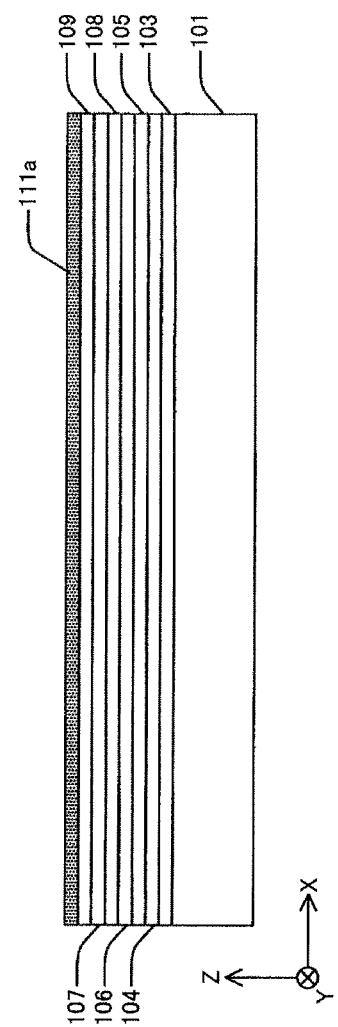

(2) An optically transparent dielectric layer 111a of P-$SiO_2$ ($Si_xO_y$) is formed by using the P-CVD method (plasma CVD method) (see FIG. 9B). In this case, the optical thickness of the dielectric layer 111a is set to be equal to $\lambda/4$. More specifically, the refractive index n of $SiO_2$ is 1.45 and the oscillation wavelength $\lambda$ is 780 nm; therefore, the practical film thickness ($\lambda/4n$) of the dielectric layer 111a is set to be 135 nm.

(3) A first resist is applied to the surface of the dielectric layer 111a, so that resist patterns 120a, 120b, and 120c are formed. The resist pattern 120a is formed to define an outer perimeter of a mesa structure (hereinafter may be simplified as "mesa"); the resist pattern 120b is formed on the region where the reflection rate is to be high in an emitting region; and the resist pattern 120c is formed to mask the region where an electrode pad is to be formed (see FIG. 9C).

Figure 10:
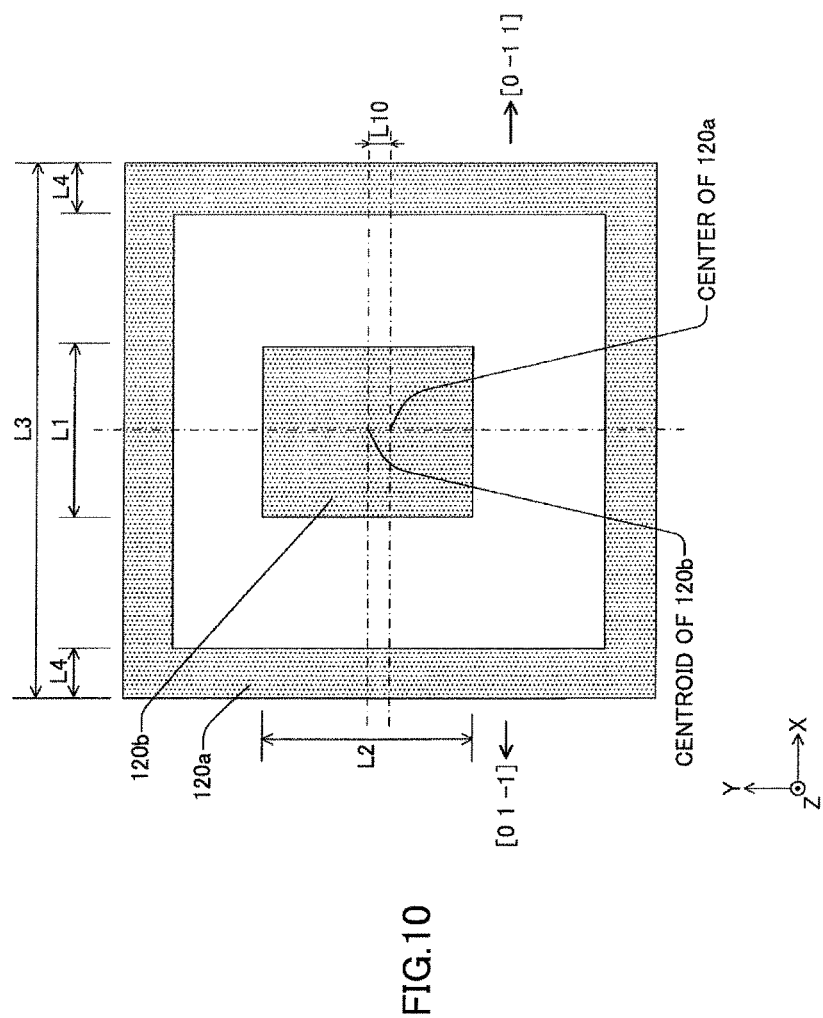
FIG. 10 is a drawing illustrating resist patterns 120*a* and 120*b*.
Figure 12C:
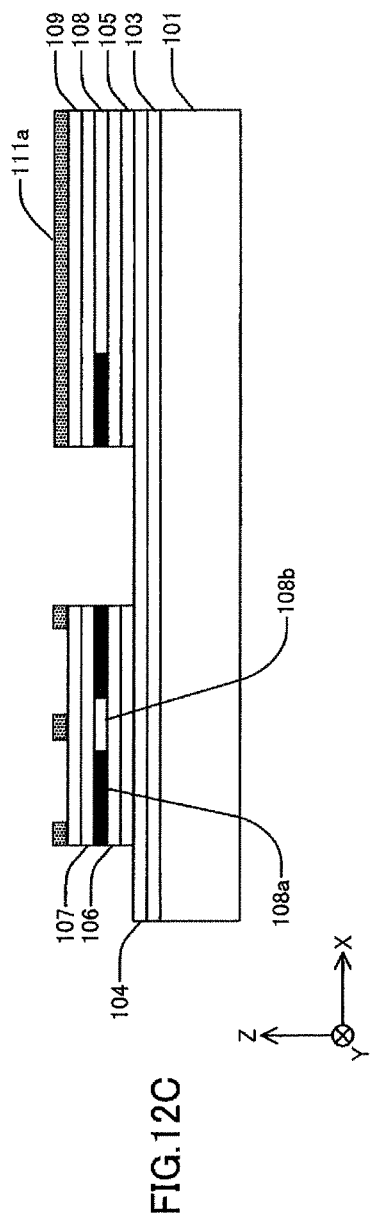

As illustrated in FIG. 10, the resist pattern 120a has a square shaped outer perimeter having one side of length L3, and is a closed pattern having a width L4. Further, as illustrated in FIG. 10, the resist pattern 120b has a rectangular shape having a length in X axis direction of L1 and a length in Y axis direction of L2. In this case, it is assumed that L1=5 μm, L2=8 μm, L3=20 μm, and L4=2 μm.

Further, the centroid of the resist pattern 120a is displaced from the centroid of the resist pattern 120b by distance L10.

In this case, the resist patterns 120a and 120b are formed at the same time. Due to this feature, a displacement of relative positional relationship between the resist pattern 120a and the resist pattern 120b does not occur.

In this embodiment, the substrate 101 is the inclined substrate (see FIG. 8A). Because of this feature, the crystal orientations extending from the four respective side walls of the mesa to the center of the mesa are to be different from each other. Due to the difference of the crystal orientations, oxidation rates may be more likely to differ among the side walls in an oxidation process. As a result, the center of a current confined structure in which the oxide surrounds a current passage region may be displaced from the center of the mesa.

In this embodiment, the oxidation rates differ in order of the direction inclined from the [0 1 1] direction to the [1 1 1] A direction by 15 degrees>[0 1 −1] direction=[0 −1 1] direction>the direction inclined from the [0 1 −1] direction to the [1 1 1] A direction by 15 degrees. Namely, relationships are oxidation rate in the +Y direction>oxidation rate in the −X direction=oxidation rate in the +X direction>oxidation rate in the −Y direction.

Because of the differences in the oxidation rates, the center of the current confined structure is displaced from the center of the mesa by approximately 0.6 μm in the −Y direction from the center of the mesa. To compensate for the displacement, the value of L10 is set at 0.6 μm so that the center of the oxide-confined structure relatively corresponds to the centroid of the resist pattern 120b.

Further, the relationships between the oxidation rate and the crystal orientation depends upon the oxidation conditions; therefore, it should be noted that the displacement amount and the displacement direction described herein are for explanatory purposes only. Namely, the displacement amount and the displacement direction are not limited to the examples described herein.

In the following, the resist patterns formed as described above may also be collectively called a "first resist pattern". Further, a resist to be used to form the first resist pattern may be called a "first resist".

As the first resist, a general positive resist may be used. In this embodiment, a resist of "OFPR800-64 cp" (TOKYO OHKA KOGYO CO., LTD) is used. Further, when the first resist is applied, a spin coater may be used so that the film thickness of the first resist can be equal to approximately 1.6 µm by adjusting the rotational speed of the spin coater. Then, exposure, development, and post baking (e.g., 2 minutes at 120° C.) processes are sequentially performed to form the first resist pattern.

(4) After UV (ultraviolet) light is irradiated onto the first resist pattern, the laminated body is placed on a hot plate heated at 150° C. and is heated for five minutes. By heating in this way, the first resist pattern is hardened. In the following, this process may also be called a "hardening process".

(5) The dielectric layer 111a is etched by wet etching using the buffered hydrofluoric acid (BHF). By this etching, a part of the dielectric layer 111a which is not masked by the first resist pattern is removed (see FIG. 11A).

(6) A second resist is applied to form a second resist pattern 123 to cover a region surrounded by the resist pattern 120a (see FIG. 11B). The resist pattern 123 is a square-shaped pattern having a side length of 18 µm. The second resist may be the same kind of resist as the first resist and may be formed under the same conditions of the first resist.

Further, as described above, the first resist pattern is hardened before the second resist is applied. Therefore, a two-layered resist structure is formed without dissolving the first resist pattern in a solvent of the second resist when the second resist is applied.

(7) By the ECR etching method using $Cl_2$ gas, the laminated body is etched by using the first resist pattern and the second resist pattern 123 as etching masks to form the mesa having side surfaces where at least the selectively-oxidized layer 108 is exposed. In this case, the bottom surface of etching is set at the upper surface of the lower spacer layer 104 (see FIG. 12A).

(8) The etching masks are removed by immersing the etching masks into acetone liquid, followed by an ultrasonic cleaning (see FIG. 12B).

(9) The laminated body is heated in water vapor. By doing this, Al (aluminum) in the selectively-oxidized layer 108 is selectively oxidized from the outer peripheral portions of the mesa, so that a non-oxidized region 108b surrounded by the Al oxide (oxidized layer) 108a remains at the center portion of the mesa (see FIG. 12C). Namely, a so-called oxide-confined structure is formed, capable of limiting the passage of the driving current of the emitting section to the center portion of the mesa only. This non-oxidized region 108b may also be called a current passage region (current injection region). By doing this, the current passage region having a square shape of, for example, 4.5 µm sides may be formed.

Figure 13:
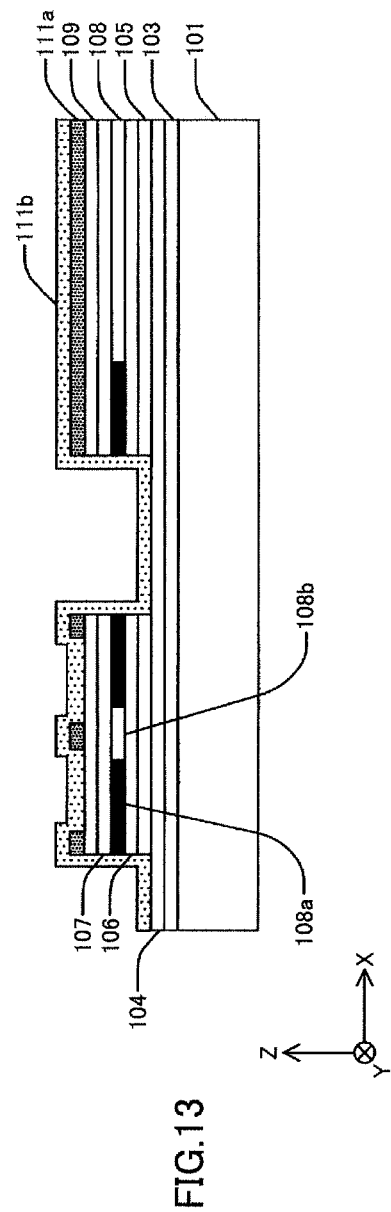
FIG. 13 is another cross-sectional view illustrating the manufacturing method of manufacturing the surface emitting laser device.

(10) An optically transparent dielectric layer 111b of P-SiN ($SiN_x$) is formed by using the P-CVD method (see FIG. 13). In this case, the optical thickness of the dielectric layer 111a is set to be equal to $2\lambda/4$. More specifically, the refractive index n of SiN is 1.89 and the oscillation wavelength $\lambda$ is 780 nm; therefore, the practical film thickness ($\lambda/4n$) of the dielectric layer 111b is set to be 103 nm.

The film forming conditions of the dielectric layer 111b are set so that the etching rate is in a range from 50 nm/min to 80 nm/min when using BHF prepared by mixing hydrofluoric acid 50% and ammonium fluoride aqueous solution 40% at a ratio of 1:10 (hereinafter simplified as "$BHF_{110}$"). A typical etching rate of the P-SiN film using BHF is in a range from 20 nm/min to 30 nm/min (see, for example, Thin Film Handbook, Japan Society for the Promotion of Science, Thin Film 113 Committee).

The $BHF_{110}$ is commercially available as the product name "110BHF" by Morita Chemical Industries Co., Ltd. and the product name "BHF110" by Daikin Industries, Ltd. Further, Daikin Industries, Ltd. provides the product name "BHF110U" including a surface-activating agent, which has good wettability so that etchant may penetrate into the fine patterns.

A main reason for increasing the etching rate of the dielectric layer 111b is to increase the difference from the etching rate of the contact layer 109.

Further, when the dielectric layer 111b is etched, over etching is performed, where the etching time is slightly longer than just-etching time. The purpose of the over etching is to reduce the variations of etching in the surface. From experience, the over etching time is in a range from 10% to 20% of the just-etching time.

Herein, the just-etching time is determined by (a) when the SiN film is formed, a Si substrate for monitoring purposes ("monitor Si substrate") is also put into the chamber to be formed; (b) after the film is formed, the center part of the monitor Si substrate is cut into 15 mm by 30 mm size to be made into a chip; (c) the chip is picked up with tweezers so that approximately half of the formed surface of the ship dips in the SHE and the chip is pulled up from the SHE to check how etching has progressed; (d) when the SiN film is fully etched, the Si chip surface shows hydrophobic characteristics (repelling BHF); therefore, the just-etching time may be determined when the Si chip surface shows hydrophobic characteristics.

The film thickness of the contact layer 109 is set to be 25 nm, and the etching rate in $BHF_{110}$ is approximately 8 nm/min.

Therefore, for example, when the etching rate of the dielectric layer 111b is 20 nm/min, the just-etching time of the dielectric layer 111b having the film thickness of 103 nm is 319 seconds, and the over etching time is 63 seconds (plus 20%). In this case, the thickness of the contact layer 109 is reduced by up to 8 nm, and this reduced amount reaches one third of the thickness when the film is formed.

On the other hand, when the etching rate of the dielectric layer 111b is in a range from 50 nm/min to 80 nm/min and the amount of over etching is 20%, the etching time is in a range from 24 seconds to 16 seconds. In this case, the thickness of the contact layer 109 is reduced up to from 2.1 nm to 2.6 nm, and the reduced amount is limited to approximately one tenth.

In this embodiment, the film forming conditions are selected so that the etching rate of the dielectric layer 111b is 65 nm/min.

Specifically, the selected film forming conditions include: a gas flow rate of $SiH_4$ (100%) of 5 sccm; a gas flow rate of $NH_3$ (100%) of 5 sccm; a flow rate of $N_2$ carrier of 200 sccm; an RF power of 135 W, and a substrate temperature of 275° C. However, the film forming conditions are one example only, and may vary depending on the film forming device to be used and the like.

Figure 14:
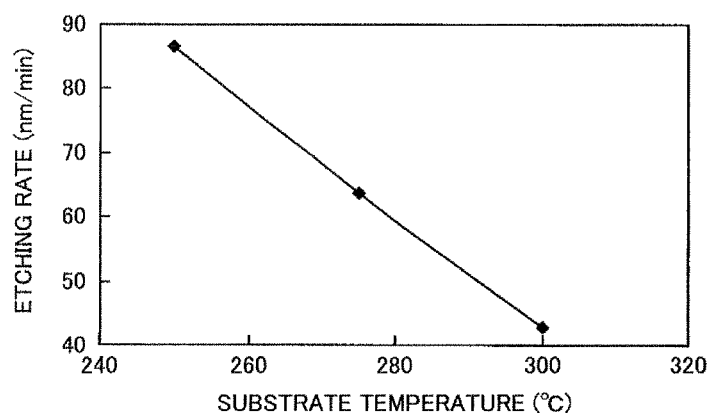
FIG. 14 is a graph illustrating relationships between substrate temperature and etching rate.
Figure 15:
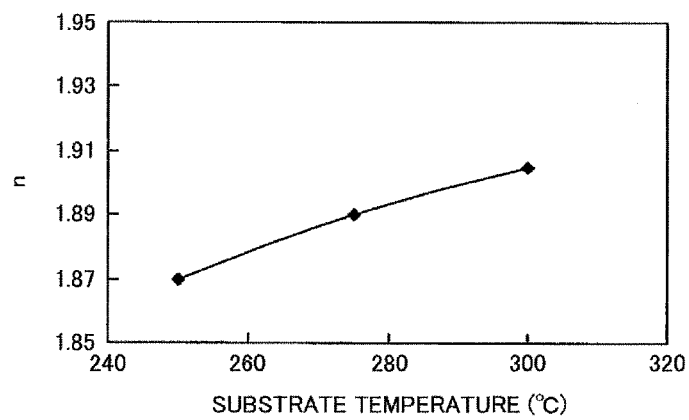
FIG. 15 is a graph illustrating relationships between the substrate temperature and a refractive index "n"

Further, as illustrated in FIG. 14, the etching rate may be arbitrarily determined by changing the substrate temperature. However, as illustrated in FIG. 15, when the substrate temperature is changed, the refractive index "n" is also changed. Therefore, it may become necessary to set (change) the actual film thickness ($=\lambda/4n$) of the dielectric layer 111b so that the optical thickness of the dielectric layer 111b is equal to $\lambda/4$.

Further, when the etching rate is increased by reducing the substrate temperature, much hydrogen (H) may be included in the dielectric layer 111b and oxygen ($O_2$) transmission rate may be degraded. However, the laser characteristics were not affected after a 1000-hour durability test under high temperature (85° C.) and high humidity (85%). Therefore, it is thought that, when the etching rate is set in a range from 50 nm/min to 80 nm/min, hydrogen (H) in the dielectric layer 111b may not affect the laser characteristics.

On the other hand, when wet etching is performed on a dielectric layer, the side etching may occur. Further, it is known that when the etching mask is a so-called translucent pattern, the size of the etched part may be larger than the sizes of the photo mask.

Figure 16:
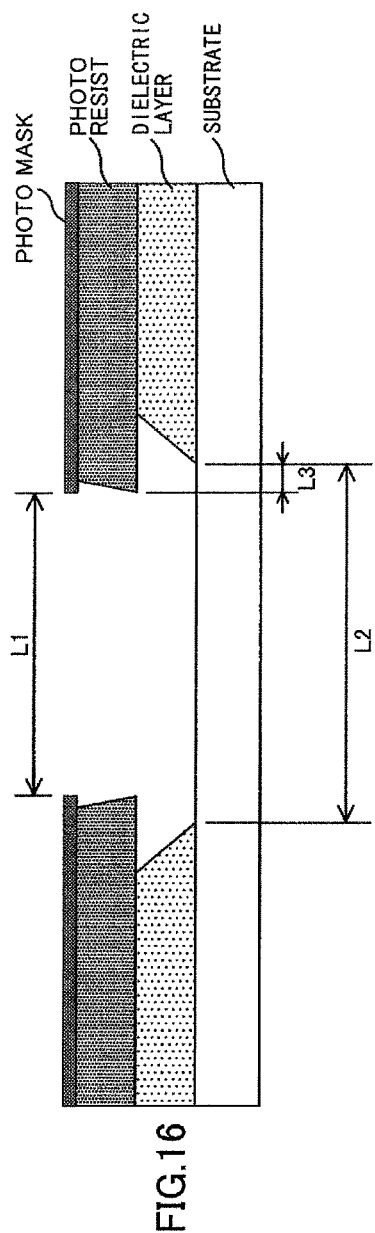
FIG. 16 is a drawing illustrating a CD (critical dimension) loss.

For example, as illustrated in FIG. 16, when wet etching is performed on the dielectric layer formed on the substrate by using a photo resist as the etching mask, the side etching L3 is generated. As a result, the opening size (L2) of the dielectric layer may be larger than the opening size (L1) of the photo mask. The difference between the opening sizes L1 and L2 is called a CD loss. In a normal patterning process, approximately 1 µm (i.e., L3≈0.5 µm) of CD loss may be generated. To compensate for the CD loss, a size smaller than the opening size (L1) may be used as the opening size (L1) of the photo mask.

The inventors of the present invention have discovered that the CD loss may be reduced by improving the adhesion between the dielectric layer and the photo resist and that to improve the adhesion, it is effective to perform a surface reforming process on the dielectric layer as preprocessing before photo resist is applied.

In this embodiment, as an example of the preprocessing, an $O_2$ plasma process is performed on the surface of the dielectric layer to replace an OH group that is a bond group on the surface of the dielectric layer by with an O bond group. According to a preliminary experiment, as an effect of the $O_2$ plasma process, the CD loss was reduced to approximately 0.4 µm.

(11) After the laminated body where the dielectric layer 111b is formed is placed in a vacuum chamber, the pressure in the vacuum chamber is lowered to approximately 3 Pa.

(12) Oxygen gas is introduced into the vacuum chamber at a flow rate of 200 sccm, and the pressure in the vacuum chamber is adjusted to 100 Pa by differential evacuation.

(13) An RE power of 200 W is supplied and the $O_2$ plasma process is performed for ten minutes. In this case, the size of the electrodes facing each other is ϕ200. Therefore, the supplied power is approximately 0.64 W/cm$^2$.

Figure 17:
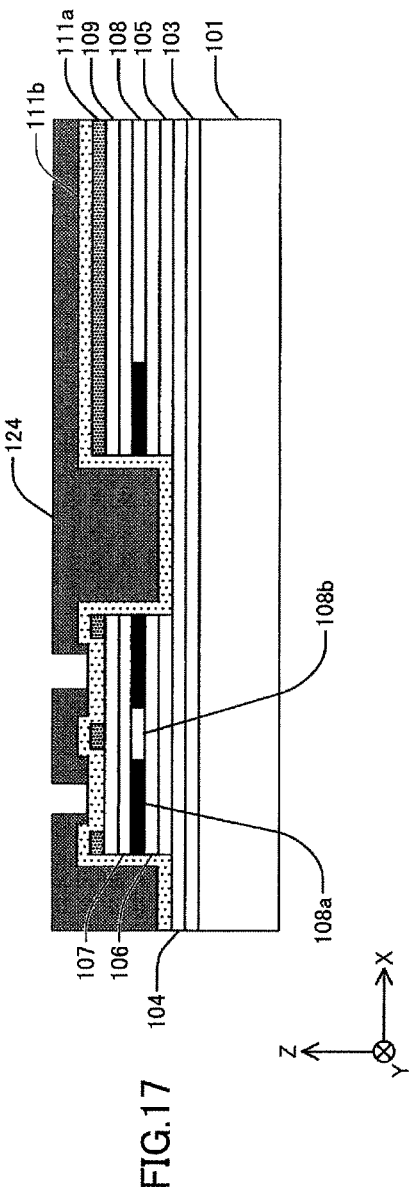
FIG. 17 is another cross-sectional view illustrating the manufacturing method of manufacturing the surface emitting laser device.
Figure 19A:
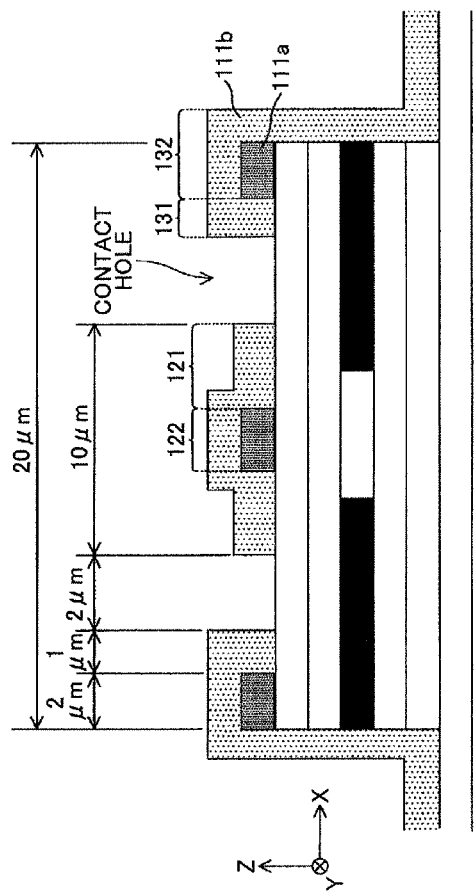
FIGS. 19A and 19B are drawing illustrating exemplary specific dimensions.
Figure 19B:
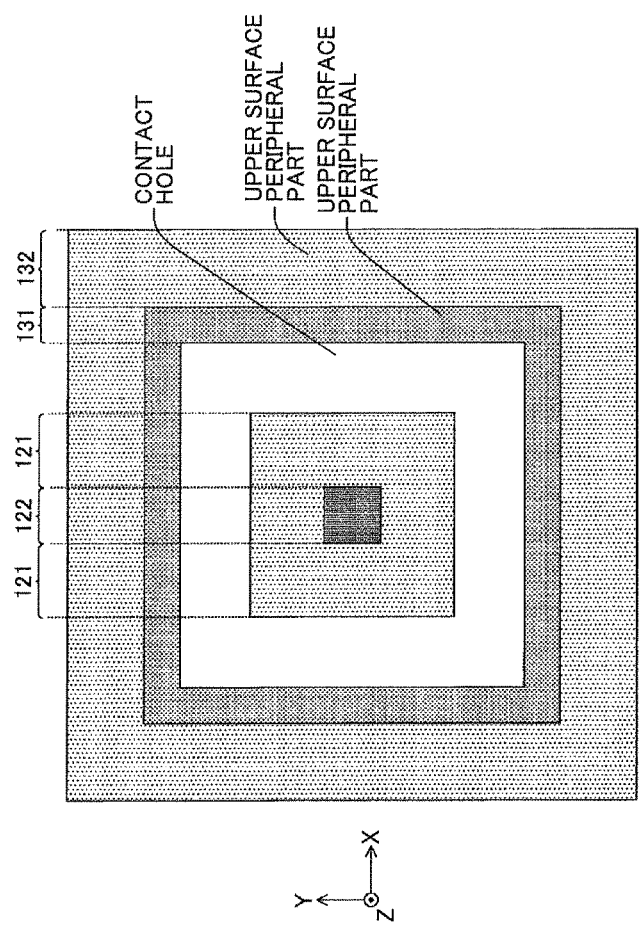

(14) A resist mask 124 for forming a contact hole for a p-side electrode 113 is formed by photolithography (see FIG. 17). Herein, based on the preliminary experiment, the photo mask is prepared so that the opening size of the photo mask is smaller than the size of the contact hole by 0.4 µm. Specifically, the designed opening size of the contact hole is 2 µm. Therefore, the photo mask is designed so that the opening size of the photo mask is 1.6 µm.

Figure 4:
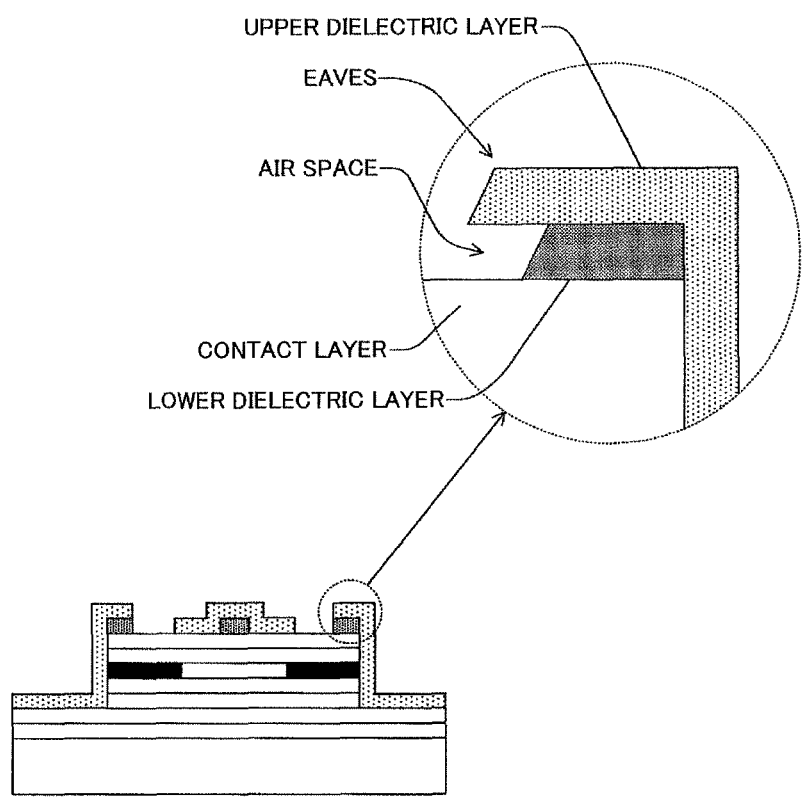
FIG. 4 is a drawing illustrating an air space formed among two dielectric layers and a contact layer.

Further, in this embodiment, the dielectric layer 111a is not exposed. Therefore, the air space (see FIG. 4) is not formed. As a result, there is no residue of etchant and resist residue, which may prevent the degradation of the service life time of the device and the degradation of the adhesion of the p-side electrode. Further, no eaves of the SiN film is generated. Therefore, bending and fracture of the eaves may not occur.

(15) The dielectric layer 111b is etched using the $BHF_{110}$, so that the contact hole of the p-side electrode 113 is formed. Herein, as the $BHF_{110}$, the "BHF110U" by Daikin Industries, Ltd. is used, and the etching time is determined to be the just-etching time (95 seconds)+over etching time (20 seconds).

(16) The resist mask 124 is removed by immersing the etching masks into acetone liquid, followed by an ultrasonic cleaning (see FIG. 18). In this case, specific sizes are described in FIGS. 19A and 19B. The dielectric areas 121 and 122 of the emitting region of the light emitting section are separated from the dielectric areas 131 and 132 of the upper surface peripheral part of the mesa structure. Further, the removed area between the dielectric areas 121 and 122 and the dielectric areas 131 and 132 is a contact region (contact hole) having the desired opening size (2 µm in this case).

(17) A resist pattern having a square shape having a side length of 10 µm is formed in a region to be formed as a light emitting section on the upper side of the mesa, and a p-side electrode material is vapor-deposited. As the p-side electrode material, a multilayer film made of Cr/AuZn/Au or a multilayer film made of Ti/Pt/Au is used.

Figures 20A, 20B:
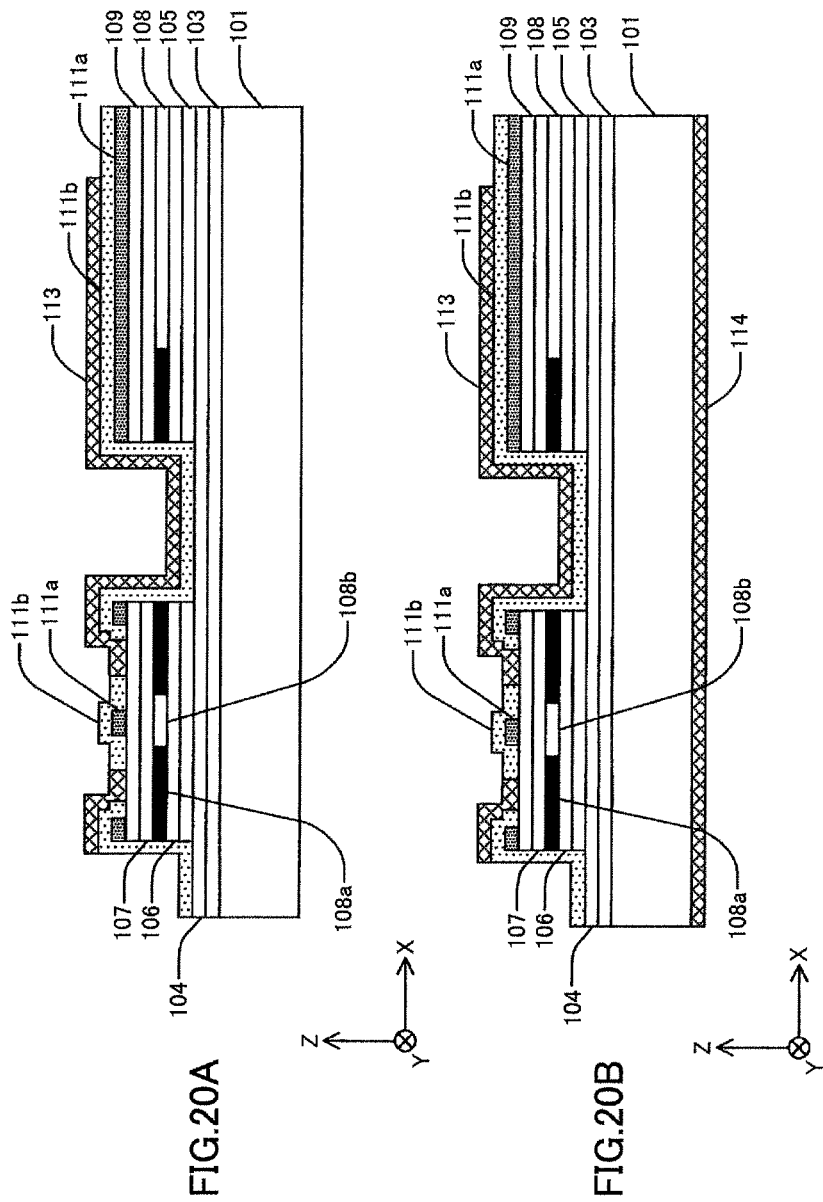
FIGS. 20A and 20B are another cross-sectional views illustrating the manufacturing method of manufacturing the surface emitting laser device.
Figure 21:
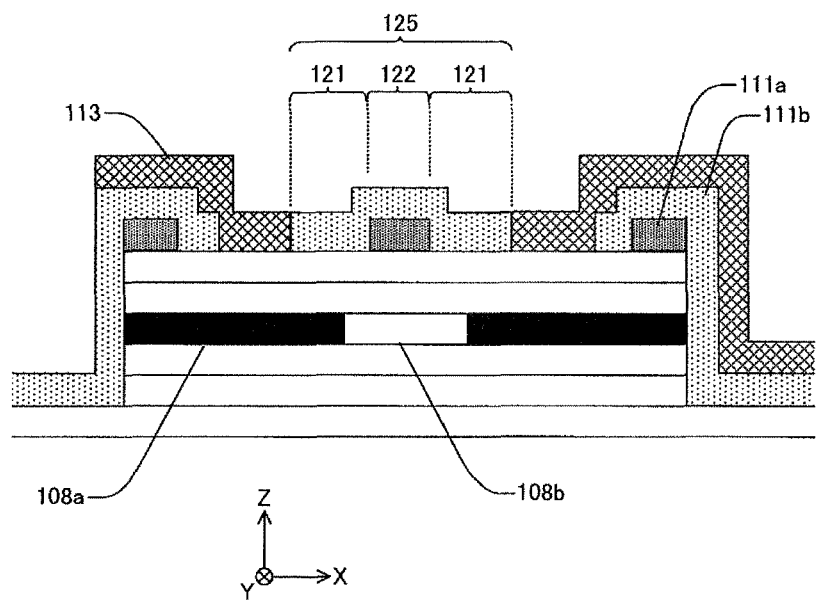
FIG. 21 is an enlarged view of a mesa upper part in FIG. 20B.

(18) The electrode material vapor-deposited at the region to be formed as the light emitting section on the upper side of the mesa is lifted off to form a p-side electrode 113 (see FIG. 20A). The region surrounded by the p-side electrode 113 is the emitting region. As illustrated in FIG. 21, the dielectric layer 111a on the lower side of the mesa peripheral part is coated by the upper dielectric layer 111b; therefore, the dielectric layer 111a is not in contact with the electrode 113. The material of the electrode 113 may be made of metal such as Au, AuZn, Cr or the like. Further, the dielectric films of the emitting region of the light emitting section are separated from the dielectric films of the upper surface peripheral part of the mesa structure. Further, at the removed area between the separated dielectric films, the electrode is formed so that the contact region is in contact with the semiconductor layer. The electrode is not in contact with the lower dielectric film in the peripheral part of the mesa structure.

(19) After polishing the rear side of the substrate 101 so that the thickness of the substrate 101 is equal to a predetermined thickness (e.g., approximately 100 µm), an n-side electrode 114 is formed (see FIG. 20B). In this case, as the n-side electrode material, a multilayer film made of AuGe/Ni/Au or a multilayer film made of Ti/Pt/Au is used.

(20) An annealing process is performed so as to produce the ohmic conductivity of the p-side electrode 113 and the n-side electrode 114. By doing this, the mesa becomes the light emitting section.

(21) The laminated body is cut into chips.

Then, after various post processing, the surface emitting laser device 100 is manufactured.

When the light emitting angles of the plural surface emitting laser devices 100 having been manufactured as described above were measured, each of the light emitting angles relative to the X axis direction and the light emitting angles relative to the Y axis direction was within a range from −0.2 degrees to +0.2 degrees.

Further, when viewed from the Z axis direction, the displacement amount between the centroid of the two dielectric layers (mode filter) of the dielectric layers 111a and 111b in the emitting region and the center of the current passage region 108b was equal to or less than 0.1 µm.

The results of each of the light emitting angles relative to the X axis direction and the light emitting angles relative to the Y axis direction being within a range from −0.2 degrees to +0.2 degrees and the displacement amount between the centroid of the two dielectric layers (mode filter) of the dielectric layers 111a and 111b in the emitting region and the center of the current passage region 108b being equal to or less than 0.1 μm may be obtained by performing the forming process (3) described above.

On the other hand, FIG. 21 is an enlarged view of the mesa part in FIG. 20B. The emitting region 125 has a square shape having one side of 10 μm. In this embodiment, the peripheral part of the emitting region 125 is coated with the optically transparent dielectric layer 111b made of P-SiN ($Si_xN_yH_z$) and having an optical thickness of λ/4. The center part of the emitting region 125 is coated with two dielectric layers which are the optically transparent dielectric layer 111a made of P-SiO$_2$ ($Si_xO_y$) and having an optical thickness of λ/4 and the optically transparent dielectric layer 111b made of P-SiN ($Si_xN_yH_z$) and having an optical thickness of λ/4.

Namely, the peripheral part of the emitting region 125 is a low reflection rate region 121 where the reflection rate is relatively low, and the center part of the emitting region 125 is a high reflection rate region 122 where the reflection rate is relatively high.

As described above, in the emitting region 125, the reflection rate in the peripheral part is relatively lower than that in the center part. Because of this feature, the higher-order transverse-mode oscillation may be better controlled without reducing the fundamental transverse mode of output light.

Further, herein, the dielectric layer 111b has a function as a protection film (passivation film) to protect the side wall of the mesa.

As may be apparent from the above description, as a method of manufacturing the surface emitting laser device 100, the method of manufacturing the surface emitting laser device according to an embodiment of the present invention is conducted.

As describe above, in the surface emitting laser device 100 according to an embodiment of the present invention, the oscillator structure including the lower semiconductor DBR 103 and the active layer 105 and the upper semiconductor DBR 107 including the selectively-oxidized layer 108 and the like are laminated on the substrate 101.

Further, the entire surface of the emitting region 125 is coated with an optically transparent dielectric made of P-SiN and the dielectric includes the high reflection rate region 122 where the reflection rate is relatively high and the low reflection rate region 121 where the reflection rate is relatively low. By having this structure, the higher-order transverse-mode oscillation may be better controlled without reducing the fundamental transverse mode of output light.

Further, when the contact hole is formed, the peripheral part of the upper surface of the mesa includes two dielectric layers 111a and 111b and the lower dielectric layer 111a is coated with the upper dielectric layer 111b and is not exposed at a surface. Because of this structure, the side etching does not occur and the air space is not formed under the dielectric layer 111a, unlike the case of FIG. 4. Accordingly, there is no residue of etchant and resist residue, which may prevent the degradation of the adhesion of the p-side electrode and the degradation of the service life time of the device.

Further, the (entire) upper surface of the mesa is coated with the dielectric layer 111b and the p-side electrode 113. Therefore, there is no space (interspace) and the degradation such as corrosion or transformation of the contact layer 109 due to water or the like may be prevented. Further, in the vicinity of the end part of the dielectric layer 111b constituting the mode filter, the dielectric layer 111b may be coated with the p-side electrode 113 in the Z axis direction.

Further, the etching rate of the dielectric layer 111b in $BHF_{110}$ is set in a range from 50 nm/min to 80 nm/min. Because of this feature, the difference from the etching rate of the contact layer 109 may be increased, thereby enabling reducing the film loss of the contact layer 109. As a result, the increase of the element resistance value may be prevented.

Figure 22:
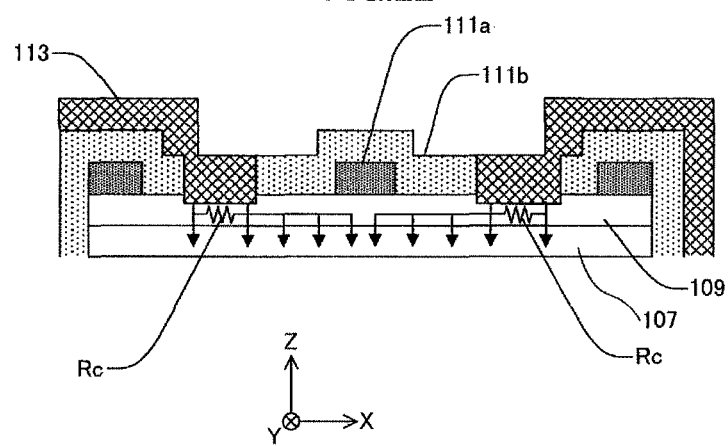
FIG. 22 is a drawing illustrating a current passage path.

On the other hand, part of the current flowing from the p-side electrode 113 vertically flows through the contact layer 109 and into the upper semiconductor DBR 107, and another part of the current flowing from the p-side electrode 113 laterally flows through the contact layer 109 to the mesa center part and into the upper semiconductor DBR 107. In this case, as illustrated in FIG. 22, if the film of the contact layer is relatively thin, the resistance Rc is increased, which impedes the current flow in the lateral direction (orthogonal to the Z axis direction) and increases the element resistance value. In the process according to an embodiment of the present invention, the film forming conditions are set so that the etching rate in the $BHF_{110}$ is in a range from 50 nm/min to 80 nm/min. Because of the film forming conditions, the increase of the element resistance value may be prevented, unlike the case of FIG. 22.

Further, the dielectric films of the emitting region 125 of the light emitting section are separated from the dielectric films of the peripheral part on the upper surface of the mesa structure. Further, at the area between the separated dielectric films, the electrode is formed so that the contact region is in contact with the semiconductor layer. Therefore, the electrode is not in contact with the lower dielectric film in the peripheral part of the mesa structure.

Further, in the patterning of the dielectric films, as the preprocessing, the O$_2$ plasma process or HMDS (hexamethyldisilazane) vapor treatment is performed for three minutes or more. Due to the preprocessing, it may become possible to more accurately manufacture fine structures (patterns).

In the optical scanning device 1010 according to an embodiment of the present invention, the light source 14 includes the surface emitting laser device 100. In this case, the magnitude (absolute value) of the light emitting angle is equal to or less than 0.2 degrees and a single fundamental lateral mode laser light is obtained. Because of the features, it may become possible to easily form a minute circular light spot at the desired position on the surface of the photosensitive drum 1030. Further, the polarization direction may be stably determined. Therefore, the surface emitting laser device 100 is insusceptible to influence of the distortion of the light spot, light amount fluctuation or the like. Because of this feature, it may become possible to form a minute circular light spot having high light density at the desired position on the photosensitive drum 1030 with a simple configuration of an optical system, thereby enabling highly-accurate light scanning on the photosensitive drum 1030.

Further, as the preprocessing for the forming the contact hole, the surface reforming process is performed. Therefore, the CD loss may be greatly improved. As a result, it may become possible to reduce the variations due to the wet etching and improve the manufacturing yield.

Further, the laser printer 1000 according to an embodiment of the present invention includes the optical scanning device 1010. Therefore, the laser printer 1000 may form a high-quality image.

Further, in the above description, a case is described where the optical thickness of the dielectric layer 111a and the optical thickness of the dielectric layer 111b are λ/4. However, the present invention is not limited to this configuration. For example, the optical thickness of the dielectric layers may be an odd multiple of λ/4.

Further, in the above description, a case is described where the normal direction of the main surface of the substrate 101 is inclined relative to the crystal orientation [100] direction toward the crystal orientation [111] A direction by an angle of 15 degrees ($\theta$=15 degrees). However, the present invention is not limited to this configuration. For example, when the inclined substrate is used as the substrate 101, the normal direction of the main surface of the substrate 101 may be inclined relative to the minus direction of the crystal orientation <100> toward the minus direction of the crystal orientation <111>.

Further, in the above description, a case is described where the substrate 101 is the inclined substrate. However, the present invention is not limited to this configuration.

Figure 23:
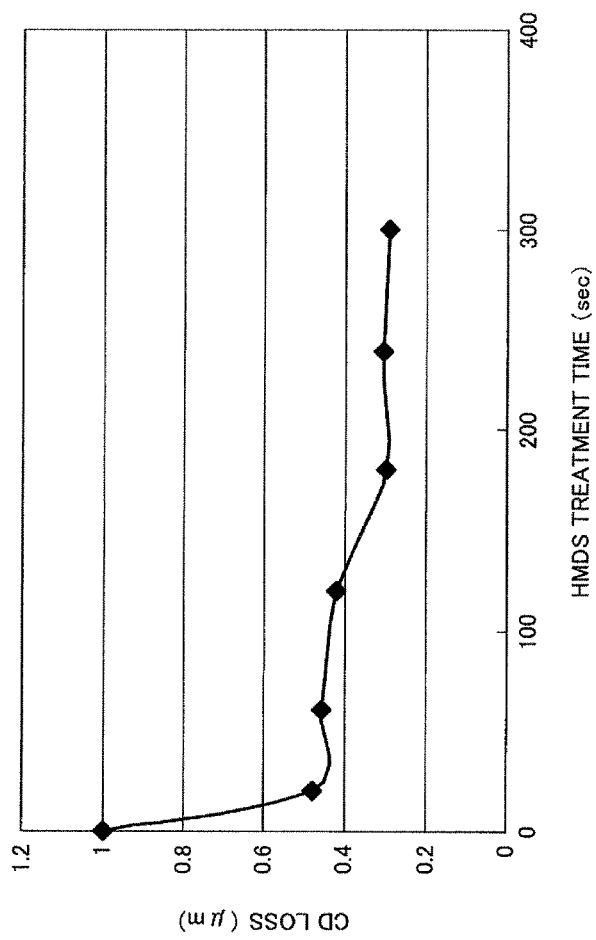
FIG. 23 is a graph illustrating relationships between HMDS (hexamethyldisilazane) treatment time and the CD loss.

Further, in the above embodiment, a case is described where as the preprocessing for forming the contact hole, the $O_2$ plasma process is performed. However, the present invention is not limited to this configuration. For example, as the preprocessing, a so-called HMDS treatment may be performed. In the HMDS treatment, hexamethyldisilazane is changed to a vapor state and applied to the surface of the dielectric layer to transform the surface of the dielectric layer to have an oleophillic property. FIG. 23 illustrates relationships between the HMDS treatment period and the CD loss. According to the relationships, when the HMDS treatment is performed for three minutes or more, the CD loss becomes stable (approximately 0.3 μm). Therefore, by setting the opening size of the photo mask smaller by 0.3 μm, and as the preprocessing and performing the HMDS treatment for three minutes or more, it may become possible to form the contact hole having the desired opening size.

To perform the HMDS treatment and photo resist application, a coater/developer apparatus is used. Further, in the HMDS treatment, while an object to be treated is heated at 80° C., HMDS vapor is introduced. Further, after the HMDS treatment, the object to be treated is cooled and the photo resist is applied. However, by inputting the conditions of the HMDS treatment and the photo resist application into the coater/developer apparatus, the HMDS treatment and the photo resist application may be automatically performed and completed.

As described above, by greatly improving the CD loss by performing the HMDS treatment, variation in wet etching may be reduced and the manufacturing yield may be improved. Further, this may be achieved simply by changing the setting values in the coater/developer apparatus without largely changing the processes.

Figure 24:
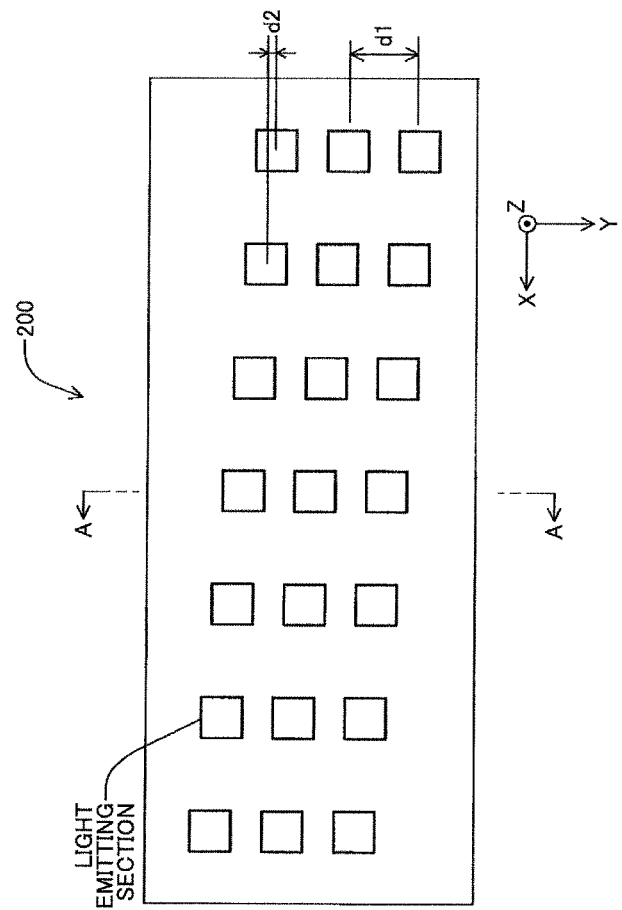
FIG. 24 is a drawing illustrating a surface emitting laser array.

Further, in the above embodiment, as shown in FIG. 24 as an example, the light source 14 may include a surface emitting laser array 200 instead of the surface emitting laser device 100.

The surface emitting laser array 200 includes two-dimensionally arranged plural (21 in this example) emitting sections formed on the same substrate. In FIG. 24, the X axis direction corresponds to the main scanning corresponding direction, and the Y axis direction corresponds to the sub scanning corresponding direction. The plural emitting sections are arranged in a manner such that when all the emitting sections are orthographically projected on a virtual line extending in the Y axis direction, the distance between the adjacent emitting sections is equal to a constant distance "d2". In this description, the distance between the adjacent emitting sections refers to the distance between the centers of adjacent emitting sections. Further, the number of the emitting sections is not necessarily limited to 21.

Figure 25:
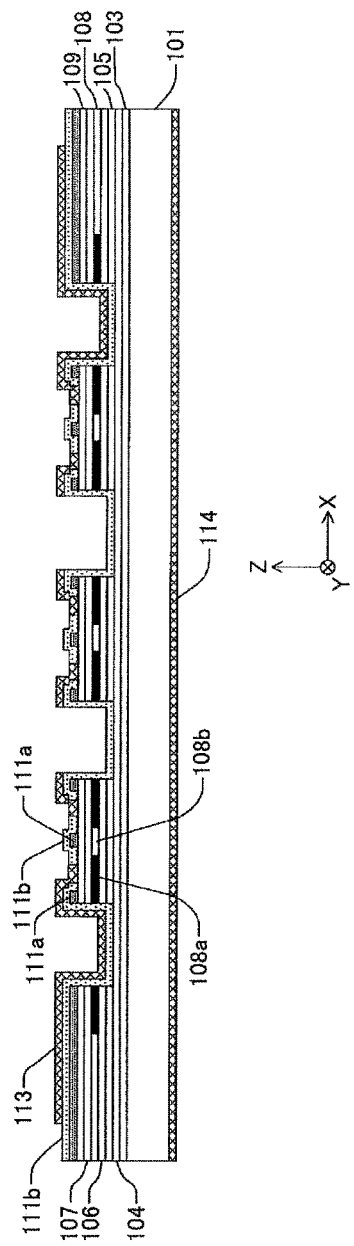
FIG. 25 is a cross-sectional view of the surface emitting laser array cut along the line A-A of FIG. 24.

As shown in FIG. 25, which is a cross-sectional view along the A-A line of FIG. 24, each of the emitting sections has a similar configuration to that of the surface emitting laser 100. Further, the surface emitting laser array 200 may be manufactured in a similar manner to that in manufacturing the surface emitting laser 100. Further, in the light emitting sections, when viewed from the Z axis direction, the displacement amount between the centroid of the two dielectric layers (mode filter) of the dielectric layers 111*a* and 111*b* in the emitting region and the center of the current passage region 108*b* may be equal to or less than 0.1 μm. Further, the magnitude (absolute value) of the light emitting angle may be equal to or less than 0.2 degrees in all directions. Further, a single fundamental lateral mode laser light having an even polarization direction may be obtained. Because of the features, it may become possible to simultaneously form twenty-one minute circular light spots having high light density at the desired positions on the photosensitive drum 1030. Further, it may become possible to prevent the degradation of the adhesion of the p-side electrode and the degradation of the service life time of the device.

Further, in the surface emitting laser array 200, when all the emitting sections are orthographically projected on a virtual line extending in the Y axis direction, the distance between the adjacent emitting sections is equal to a constant distance d2. Because of this configuration, by controlling the turn-on timings of the emitting sections, the configuration of the surface emitting laser array 200 may be regarded as a configuration where the emitting sections are arranged at regular intervals in the sub scanning direction on the photosensitive drum 1030.

Further, for example, when the distance d2 is set to 2.65 μm and the magnification of the optical system is set to 2 times, high density writing of 4800 dpi (dots per inch) may be achieved. Obviously, for example, the density may be further enhanced by increasing the number of the emitting sections in the main-scanning corresponding direction, by changing the array layout by reducing the pitch d1 in the sub-scanning corresponding direction to further reduce the distance d2, or by reducing magnification of the optical system. As a result, higher quality printing may be achieved. Further, the writing distance in the main scanning direction may be easily controlled by controlling the turn-on timings of the emitting sections.

Further, in this case, even when the writing dot density is increased, the laser printer 1000 may perform printing without reducing the printing speed. Further, when assuming that writing dot density is to be maintained, the printing speed may be further increased.

Further, in the above embodiment, instead of using the surface emitting laser device 100, a surface emitting laser array may be used that is manufactured in the same manner as the surface emitting laser device 100 and that includes one-dimensionally arranged emitting sections each similar to the surface emitting laser device 100.

Further, in the above embodiment, a case is described where the oscillation wavelength of the emitting section is 780 nm band. However, the present invention is not limited to this configuration. The oscillation wavelength may be changed in accordance with the characteristics of the photosensitive body.

Further, the above-described surface emitting laser 100 and the surface emitting laser array 200 may also be used in applications other than an image forming apparatus. In such a case, the oscillation wavelength may be, for example, 650 nm band, 850 nm band, 980 nm band, 1.3 μm band, 1.5 μm band or the like. Further, in this case, as the semiconductor material used for the active layer, an appropriate mixed crystal semiconductor material in accordance with the oscillation wavelength may be used. For example, an AlGaInP-based mixed crystal semiconductor material may be used in 650 nm band; an InGaAs-based mixed crystal semiconductor material may be used in 980 nm band; and a GaInNAs(Sb)-based mixed crystal semiconductor material may be used in 1.3 μm band and 1.5 μm band.

Further, in the above embodiment, a case is described where the image forming apparatus is the laser printer 1000. However, the present invention is not limited to this configuration.

For example, the image forming apparatus may include an image forming apparatus capable of directly irradiating a laser light on a medium (e.g., a sheet) having reversibility so that coloring/discoloring occurs on the medium based on the irradiated laser lights.

For example, the medium may be a printing plate known as CTP (Computer to Plate). Namely, the optical scanning device 1010 may include an image forming apparatus directly forming an image on the printing plate material by laser ablation to form a printing plate.

Further, for example, the medium may be so-called rewritable paper. In such a medium, as a recording layer, a material described below is applied on a supporting body made of paper, resin film or the like. Then, by controlling thermal energy of the laser light, the coloring/discoloring operations may be reversibly performed on the medium.

There are a transparent-opaque type rewritable marking method and a coloring/discoloring type rewritable marking method using leuco dye. The present invention may be applied to any of those methods.

In the transparent-opaque type rewritable marking method, molecules of fatty acid are dispersed in a polymer thin film. When heated at a temperature equal to or higher than 110° C., resin expands due to melting of the fatty acid. After that, when cooled, the fatty acid is in a supercooled condition and remains in liquid form, and the expanded resin is solidified. After that, the fatty acid is solidified and shrinks to become polycrystalline molecules, thereby generating air gaps between resin and molecules. Due to the air gaps, light is scattered and white color is present. Next, when heated at a delete temperature range from 80° C. to 110 t, the fatty acid is partially melted and the resin thermally expands to fill the air gaps. Under this condition, when cooled, the transparent status appears and as a result, the image is deleted.

In the rewritable marking method using leuco dye, a reversible coloring/discoloring reaction is used based on a colorless leuco-type dye and a developing-decoloring agent having a long-chain alkyl group. In this method, when heated due to the laser light, the leuco dye and the developing-decoloring agent are reacted together to develop color. Then, when rapidly cooled, the developed color status is maintained. After that, when heated and then gradually cooled, due to the self-aggregation activity of the long-chain alkyl group of the developing-decoloring agent, the phase separation occurs. Namely, the leuco dye and the developing-decoloring agent are physically separated and as a result, the color disappears.

Further, the medium may be so-called color rewritable paper in which photochromic compounds are applied (provided) on the supporting body made of paper, resin film or the like. The photochromic compounds includes a photochromic compound which develops cyan (C) color upon receiving an ultraviolet light and deletes the color upon receiving R (red) visible light, a photochromic compound which develops magenta (M) color upon receiving an ultraviolet light and deletes the color upon receiving G (green) visible light, and a photochromic compound which develops yellow (Y) color upon receiving an ultraviolet light and deletes the color upon receiving B (blue) visible light.

In the use of the medium, first, an ultraviolet light is irradiated to develop deep black color, and the irradiation time periods and the intensities of the RGB lights are adjusted to control color optical densities of the three types of materials which develop YMC colors to display full colors. In this case, when high-intensity RGB lights are irradiated, the three types of YMC colors may be deleted to generate pure white color.

An apparatus capable of controlling light energy to use a medium having the reversible coloring/discoloring function as described above may also be achieved as the image forming apparatus having the light scanning device as described in the above embodiment.

Further, for example, the present invention may also be applied to an image forming apparatus using a silver-salt film as an image carrier. In this case, a latent image is formed on the silver-salt film by optical scanning, and the latent image may be visualized by a process similar to a developing process performed in a typical silver salt photographic process. Then, the image may be transferred to a printing paper by performing a process similar to the printing process in the typical silver salt photographic process. Such an image forming apparatus may include an optical photoengraving apparatus and an optical drawing apparatus capable of drawing a CT scan image and the like.

Figure 26:
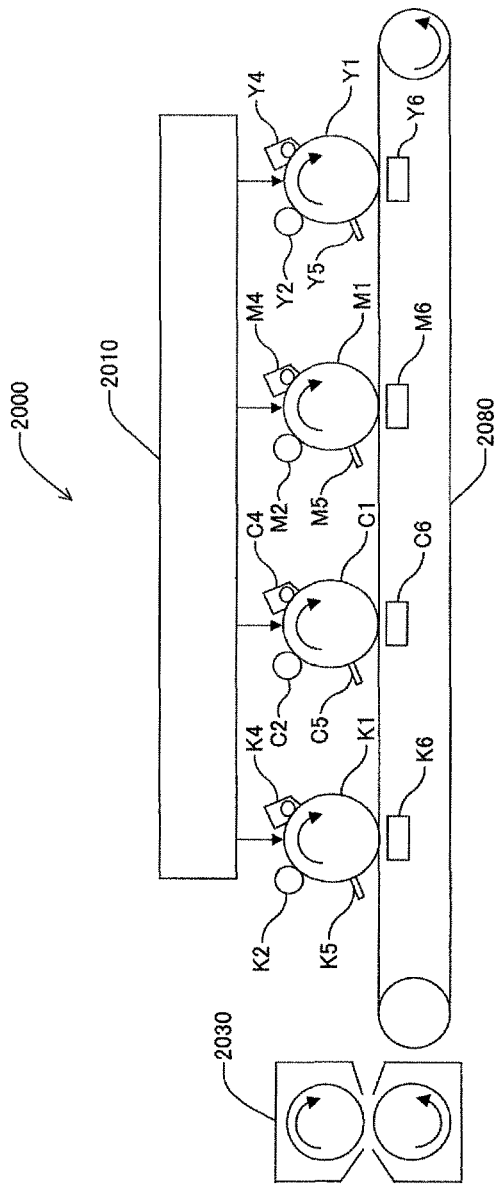
FIG. 26 is a schematic drawing illustrating a configuration of a color printer.

Further, as shown in FIG. 26 as an example, the image forming apparatus may be a color printer 2000 having plural photosensitive drums.

The color printer 2000 is a tandem-type multi-color printer forming a full-color image by combining four colors (black, cyan, magenta, and yellow). The color printer 2000 includes a station for black (K) (having a photosensitive drum K1, a charger K2, a developing device K4, a cleaning unit K5, and a transfer device K6), a station for cyan (C) (having a photosensitive drum C1, a charger C2, a developing device C4, a cleaning unit C5, and a transfer device C6), a station for magenta (M) (having a photosensitive drum M1, a charger M2, a developing device M4, a cleaning unit M5, and a transfer device M6), a station for yellow (Y) (having a photosensitive drum Y1, a charger Y2, a developing device Y4, a cleaning unit Y5, and a transfer device Y6), and an optical scanning device 2010, a transfer belt 2080, a fixing unit 2030 and the like.

The photosensitive drums rotate in the respective arrow directions shown in FIG. 26. In the vicinity of each photosensitive drum, along the rotating direction, the charger, the developing device, the transfer device, and the cleaning unit are disposed in this order. The chargers uniformly charge the surface of the respective photosensitive drums. The optical scanning device 2010 irradiates light onto the surfaces of the photosensitive drums to form latent images on the respective photosensitive drums, the surfaces having been charged by the respective chargers. Then, colored toner images are formed on the surfaces of the photosensitive drums by the respective developing devices. Further, the colored toner images are superposed onto the recording paper on the transfer belt 2080 by the respective transfer devices. Finally, the superposed colored image is fixed to the recording paper by the fixing unit 2030.

The optical scanning device 2010 includes light sources for the respective colors, the light sources including a surface emitting laser device manufactured in the same manner as the surface emitting laser device 100 or a surface emitting laser array similar to the surface emitting laser array 200. Because of this feature, the optical scanning device 2010 may achieve the same effect as that achieved by the optical scanning device 1010. Further, the color printer 2000 includes the optical scanning device 2010; therefore, the color printer 2000 may achieve the same effect as that achieved by the laser printer 1000.

Further, in the color printer 2000, a color displacement may occur due to a manufacturing error, a positional error or the like of the parts used therein. Even in such a case, when the light sources of the optical scanning device 2010 have the surface emitting laser array similar to the surface emitting laser array 200, the color displacement may be better controlled by appropriately selecting the emitting sections to be turned ON.

As described above, the surface emitting laser device and the surface emitting laser array according to embodiments of the present invention may be suitable for improving service life time of the device while the higher-order transverse-mode oscillation are better controlled without reducing the fundamental transverse mode of output light. Further, an optical scanning device according to an embodiment of the present invention may be suitable for performing highly-accurate optical scanning. Further, an image forming apparatus according to an embodiment of the present invention may be suitable for forming high-quality images. Further, a manufacturing method of manufacturing a surface emitting laser device may be suitable for stably manufacturing a surface emitting laser device having a long service life time and characteristics that the higher-order transverse-mode oscillations are better controlled without reducing the fundamental transverse mode of output light.

According to an embodiment of the present invention, a surface emitting laser device includes a light emitting section having a mesa structure where a lower reflection mirror, an oscillation structure, and an upper reflection mirror are laminated on a substrate, the oscillation structure including an active layer, the upper reflection mirror including a current confined structure where an oxide surrounds a current passage region; a first dielectric film that coats the entire surface of an emitting region of the light emitting section, the transparent dielectric including a part where the refractive index is relatively high and a part where the refractive index is relatively low; and a second dielectric film that coats a peripheral part on the upper surface of the mesa structure. Further, the dielectric film includes a lower dielectric film and an upper dielectric film, and the lower dielectric film is coated with the upper dielectric film.

By having this structure, it may become possible to improve the service life time of the device while the higher-order transverse-mode oscillations are better controlled without reducing the fundamental transverse mode of output light.

According to another embodiment of the present invention, a surface emitting laser array includes the surface emitting laser device according to an embodiment of the present invention.

By having the surface emitting laser device according to an embodiment of the present invention, in the light emitting section, it may become possible to improve the service life time of the device while the higher-order transverse-mode oscillations are better controlled without reducing the fundamental transverse mode of output light.

According to another embodiment of the present invention, an optical scanning device scanning a surface to be scanned with light includes a light source including the surface emitting laser device according to an embodiment of the present invention, a deflector that deflects light from the light source, and a scanning optical system that focuses the light deflected by the deflector onto the surface to be scanned.

By having the surface emitting laser device according to an embodiment of the present invention, it may become possible to perform highly-accurate light scanning.

According to another embodiment of the present invention, an optical scanning device scanning a surface to be scanned with light includes a light source including the surface emitting laser array according to an embodiment of the present invention, a deflector that deflects light from the light source, and a scanning optical system that focuses the light deflected by the deflector onto the surface to be scanned.

By having the surface emitting laser array according to an embodiment of the present invention, it may become possible to perform highly-accurate light scanning.

According to another embodiment of the present invention, an image forming apparatus includes an image carrier and the optical scanning device according to an embodiment of the present invention that scans light onto the image carrier, the light being modulated based on image information.

As a result of having the optical scanning device according to an embodiment of the present invention, it may become possible to perform highly-accurate light scanning.

According to an embodiment of the present invention, there is a method of manufacturing a surface emitting device including a mesa structure which becomes a light emitting section in a laminated body where a lower reflection mirror, an oscillation structure, and an upper reflection mirror are laminated on a substrate, the oscillation structure including an active layer, the upper reflection mirror including a current confined structure, and an emitting region including a part where the refractive index is relatively high and a part where the refractive index is relatively low. The method includes forming a first dielectric film on an upper surface of the laminated body before the mesa structure is formed; forming a first resist pattern on an upper surface of the first dielectric film, the first resist pattern including a pattern defining an outer shape of the mesa structure and a pattern protecting a region corresponding to the part where the refractive index is relatively high in the emitting region; etching the first dielectric layer using the first resist pattern as an etching mask; forming a second resist pattern protecting a region corresponding to an entirety of the emitting region; forming the mesa structure; forming the current confined structure; and forming a second dielectric film on an upper surface of the laminated body where the current confined structure is formed, the second dielectric film being formed at a wet etching rate lower than the wet etching rate of the first dielectric film.

By using the above method, it may become possible to stably mass-produce the surface emitting laser devices having longer service life time and having characteristics that the higher-order transverse-mode oscillations are better controlled without reducing the fundamental transverse mode of output light.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A method of manufacturing a surface emitting device including a mesa structure which becomes a light emitting section in a laminated body where a lower reflection mirror, an oscillation structure, and an upper reflection mirror are laminated on a substrate, the oscillation structure including an active layer, the upper reflection mirror including a current confined structure, and an emitting region including a part where the refractive index is relatively high and a part where the refractive index is relatively low, the method comprising:
forming a first dielectric film on an upper surface of the laminated body before the mesa structure is formed;
forming a first resist pattern on an upper surface of the first dielectric film, the first resist pattern including a pattern defining an outer shape of the mesa structure and a pattern protecting a region corresponding to the part where the refractive index is relatively high in the emitting region;
etching the first dielectric layer using the first resist pattern as an etching mask;
forming a second resist pattern protecting a region corresponding to an entirety of the emitting region;
forming the mesa structure;
forming the current confined structure; and
forming a second dielectric film on an upper surface of the laminated body where the current confined structure is formed, the second dielectric film being formed at a wet etching rate lower than the wet etching rate of the first dielectric film.

2. The method of manufacturing a surface emitting device according to claim 1, further comprising:
performing a preprocessing to perform surface reforming on a surface of the second dielectric film; and
applying a photo resist to a surface of the reformed surface of the second dielectric film.

3. The method of manufacturing a surface emitting device according to claim 2,
wherein in the preprocessing, an $O_2$ plasma process is performed.

4. The method of manufacturing a surface emitting device according to claim 2,
wherein in the preprocessing, an HMDS treatment is performed for three minutes or more.

* * * * *

UNITED STATES PATENT AND TRADEMARK OFFICE
CERTIFICATE OF CORRECTION

| | | |
|---|---|---|
| PATENT NO. | : 8,989,231 B2 | Page 1 of 1 |
| APPLICATION NO. | : 13/915921 | |
| DATED | : March 24, 2015 | |
| INVENTOR(S) | : Hiroyoshi Shouji and Shunichi Sato | |

It is certified that error appears in the above-identified patent and that said Letters Patent is hereby corrected as shown below:

Insert a related U.S. application data on the title page of the patent, with the following:

Item -- (63) Divisional of application No. 13/084,942, filed on April 12, 2011. --

Signed and Sealed this
Eleventh Day of August, 2015

Michelle K. Lee
*Director of the United States Patent and Trademark Office*